United States Patent
Sakamoto

(10) Patent No.: US 6,445,632 B2
(45) Date of Patent: Sep. 3, 2002

(54) SEMICONDUCTOR MEMORY DEVICE FOR FAST ACCESS

(75) Inventor: Wataru Sakamoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/778,072

(22) Filed: Feb. 7, 2001

(30) Foreign Application Priority Data

Feb. 15, 2000 (JP) ........................................ 2000-036512

(51) Int. Cl.$^7$ ................................................ G11C 7/00
(52) U.S. Cl. ...................... 365/205; 365/191; 365/196; 365/206; 365/207
(58) Field of Search ..................... 365/189.01, 230.01, 365/205, 191, 196, 206, 207

(56) References Cited

U.S. PATENT DOCUMENTS

| 5,787,457 A | | 7/1998 | Miller et al. | |
|---|---|---|---|---|
| 5,822,264 A | * | 10/1998 | Tomishima et al. | ......... 365/222 |
| 5,831,924 A | * | 11/1998 | Nitta et al. | ............. 365/230.03 |
| 5,956,285 A | * | 9/1999 | Watanabe et al. | ....... 365/230.03 |
| 5,973,983 A | * | 10/1999 | Hidaka | ................... 365/230.03 |
| 6,088,286 A | * | 7/2000 | Yamauchi et al. | ...... 365/230.06 |
| 6,091,659 A | * | 7/2000 | Watanabe et al. | ....... 365/230.03 |
| 6,147,925 A | * | 11/2000 | Tomishima et al. | .... 365/230.03 |
| 6,205,071 B1 | * | 3/2001 | Ooishi | ......................... 365/207 |
| 6,233,181 B1 | * | 5/2001 | Hidaka | ....................... 365/200 |
| 6,233,195 B1 | * | 5/2001 | Yamazaki et al. | ...... 365/230.03 |
| 6,246,614 B1 | * | 6/2001 | Ooishi | ......................... 365/191 |

FOREIGN PATENT DOCUMENTS

| JP | 08-087879 | | 4/1996 |
|---|---|---|---|
| JP | 410199262 A | * | 7/1998 |
| JP | 10-208471 | | 8/1998 |
| JP | 411260064 A | * | 9/1999 |

* cited by examiner

Primary Examiner—Viet Q. Nguyen
(74) Attorney, Agent, or Firm—McDermott, Will & Emery

(57) ABSTRACT

Sense amplifier circuits are arranged on either side of each column of a memory block through a bit line isolation circuit. A sensing operation is performed with a bit line pair and the sense amplifier circuit being isolated. The bit line pair is isolated from the sense amplifier circuit during the sensing operation, so that another word line can be set in the selectable state. Another row can be driven into the selected state when data access with respect to the sense amplifier circuit is performed. Thus, an overhead in page switching in a memory system is reduced and a bus utilization efficiency is improved.

2 Claims, 18 Drawing Sheets

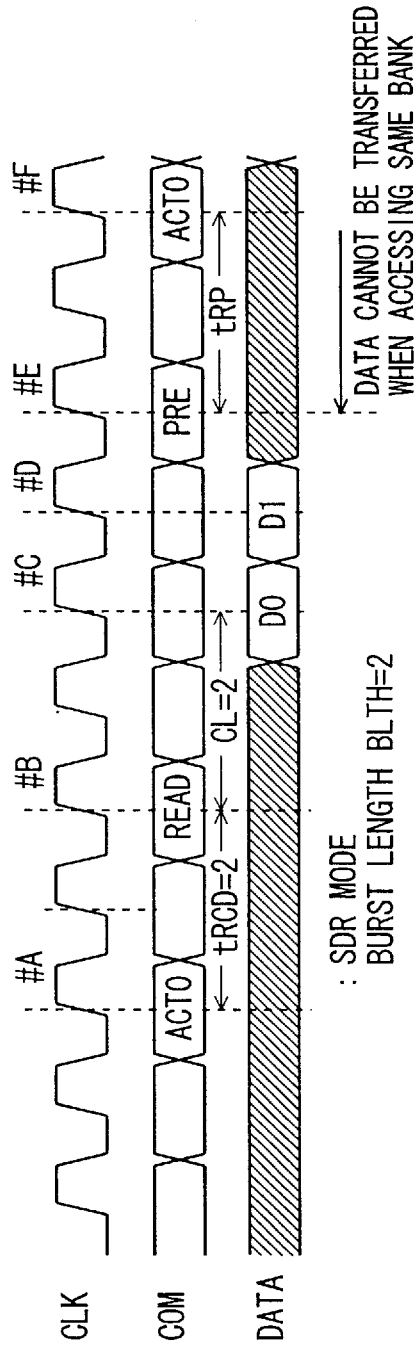
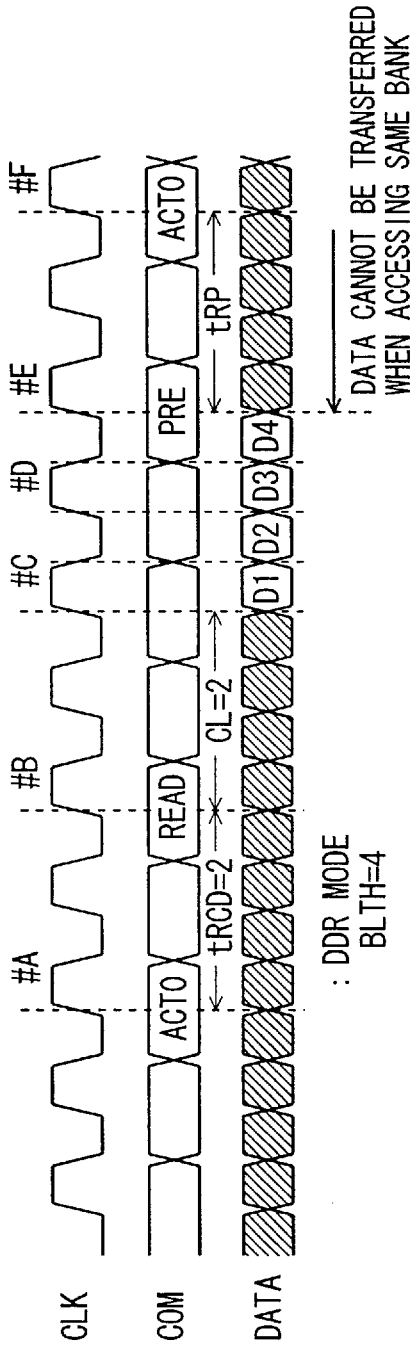

SEMICONDUCTOR MEMORY DEVICE FOR FAST ACCESS

BACKGROUND OF THE INVENTION

1. Field of the Invention

The present invention relates to semiconductor memory devices and, more specifically to a structure enabling fast row access of dynamic random access memory (DRAM).

2. Description of the Background Art

In a dynamic random access memory (hereinafter abbreviated as a DRAM), a memory cell includes an MOS transistor (an insulated gate type field effect transistor) and a capacitor. Thus, the dynamic random access memory is smaller in number of components of a memory cell and correspondingly smaller in cell area, as compared with an SRAM (Static Random Access Memory) whose memory cell requires four transistors and two load elements. Therefore, the DRAM is suited for a memory with a large storage capacity and widely used as a main storage in a data processing system.

In the DRAM, memory cell data is destructively read and the memory cell data is sensed, amplified and latched by a sense amplifier circuit. The destructively read memory cell data is restored by latch data of the sense amplifier circuit. A column selection is performed with the memory cell data latched by the sense amplifier circuit for data access (data writing or reading). Unlike the SRAM, in the DRAM, after a selected row is driven into a non-selected state, another row must be driven into a selected state in switching pages (row: corresponding to one word line). Thus, after a circuit (a row related circuit) for row selection is once set in a precharged state, another row must be selected. Consequently, an overhead in switching pages is relatively large and a row access (a time required from row selection to data reading) takes a long time.

To reduce the overhead in switching pages, a plurality of banks are provided, which are accessed in an interleaved manner. More specifically, during data access to one bank, a row of another bank is driven into a selected state. As soon as data access to the one bank is completed, successively, the selected row of another bank is accessed. Thus, the page switching is effectively hidden by the data access operation, whereby a penalty is not caused in page switching. Accordingly, for example, during data access in a page mode for fast data access, wait time of a processor such as a central processing unit (CPU) is eliminated in a data processing system and the performance of the system is improved.

A clock synchronous DRAM (SDRAM) has been widely used which performs data transfer in synchronization with a clock signal such as a system clock, to increase a data transfer speed.

FIG. 26A is a diagram showing an exemplary operation sequence in data reading in a conventional SDRAM. In the SDRAM, an operation mode is designated by a command COM.

Referring to FIG. 26A, in a cycle #A of a clock signal CLK, an active command ACT for driving a row into a selected state is applied. In the SDRAM, a plurality of banks are provided and the designation of a bank 0 is represented by the suffixed number of command ACT in FIG. 26A. Active command ACT0 triggers selection of a row (a word line) in bank 0 in accordance with a concurrently applied row address, and memory cell data connected to the selected row are amplified and latched by sense amplifier circuits.

In a clock cycle #B, a read command READ instructing data reading is applied. Then, a memory cell is selected in accordance with a concurrently applied column address and data of the selected memory cell is read. A prescribed period of time is required after application of the read command for column selection and before the selected memory cell data is actually read externally. This period of time is referred to as a column latency CL. FIG. 26A shows an exemplary data reading operation when column latency CL is 2.

When column latency CL (=2) is elapsed in accordance with read command READ that has been applied in clock cycle #B, data D0 and D1 are respectively read prior to rising edges of clock signals CLK in clock cycles #C and #D. The number of data consecutively read by one read command READ is referred to as a burst length BTLH. FIG. 26A represents the data reading operation when burst length BTLH is 2. Data which is in a definite state at the rising edge of clock signal CLK is transferred, so that an externally provided processor samples the data at the rising edge of clock signal CLK. A transfer speed of data D is determined by a frequency of clock signal CLK, and fast data transfer is enabled.

When a row other than that selected by active command ACT0 is to be accessed in the same bank, a precharge command PRE is applied in a clock cycle #E and bank 0 is brought back into a precharged state in the SDRAM. When a prescribed period of time is elapsed, active command ACT0 is again applied in a clock cycle #F, and another row is designated, which is then driven into the selected state.

A mode in which data is transferred in synchronization with one edge of clock signal CLK is referred to as an SDR (Single Data Rate) mode. The SDRAM essentially has an array structure similar to that of a DRAM though data is transferred in accordance with the clock signal. Accordingly, after the row is driven into the selected state and data of the selected memory cells are sensed, amplified and latched by the sense amplifier circuits, next read command READ can be applied.

The time required between operations of a circuit for row selection (a row related circuit) and a circuit for column selection (a column related circuit) is generally called an RAS-CAS delay time tRCD. FIG. 26A relates to the case where delay time tRCD is 2 clock cycles by way of example. Accordingly, it takes 4 clock cycles after active command ACT is applied and before effective data is externally output. Further, a time generally equal to an RAS precharge time tRP is required after precharge command PRE is applied and before active command ACT is applied then. This is because row selection must be newly performed after an internal circuit is surely brought back to the precharged state.

Consequently, in consecutively accessing different rows in the same bank even if a plurality of banks are provided, the above described overhead is caused due to page switching. Thus, memory cell data cannot be transferred at a high speed and the performance of the system is decreased.

To achieve higher data transfer speed than in the SDR mode, an operation mode called a DDR mode is becoming popular. In the DDR mode, as shown in FIG. 26B, data is transferred in synchronization with rising and falling edges of clock signal CLK. Here, FIG. 26B represents an exemplary operation sequence in data reading when RAS-CAS delay time tRCD and column latency CL are both 2 and burst length BTLH is 4. The DDR mode SDRAM has an internal structure which is substantially the same as that of the SDR mode SDRAM. Accordingly, 4 clock cycles are required after active command ACT0 is applied in clock cycle #A and before effective data is output. In the DDR mode, data can be transferred in synchronization with both of rising and falling edges of clock signal CLK, and data can be transferred at a higher speed than in the SDR mode. However, data are transferred every half-cycle of clock signal CLK. Thus, the DDR mode is inferior to the SDR mode in terms of an efficiency of a bus utilization. In the SDR mode when burst length BTLH is 4, data is transferred over 4 clock cycles. On the other hand, in the DDR mode when the burst length is 4, data is transferred only for 2 clock cycles and not transferred for the remaining clock cycle period.

FIG. 27 is a graph showing a relationship between an operation frequency and a bus utilization efficiency when transferring data in SDR and DDR modes. Burst length BTLH is 4 in each of the SDR and DDR modes. A transfer time of internal data is determined by the internal structure of the SDRAM, and column latency CL changes in accordance with the operation frequency. If the operation frequency increases to 125 MHz or 133 MHz in the SDR mode, column latency CL increases. Since data is not transferred during column latency CL, the bus utilization efficiency decreases to about 0.55. Here, in FIG. 27, the bus utilization efficiency relates to data transfer when the SDRAM is randomly accessed and accesses to the same bank and to different banks occur at the same probability.

In the DDR mode, data is transferred in synchronization with both of rising and falling edges of clock signal CLK. Thus, the data transfer operation per se is performed at a high speed, and the processor can transfer required data in a short period of time. However, RAS—CAS delay time tRCD and RAS precharge time tRP are the same as in the SDR mode, and these are predetermined. If the operation frequency increases, the clock cycle number per time also increases. Accordingly, as the operation frequency increases, the clock cycle number corresponding to the overhead in page switching increases in the DDR mode, whereby the bus utilization efficiency decreases.

In the DDR mode, data is transferred in synchronization with both of rising and falling edges of clock signal CLK. Thus, although the processor can transfer required data in a short period of time, there is a period during which data is not transferred on the bus. During data transfer in the DDR mode, since the data transfer period is shorter than in the SDR mode, the bus utilization efficiency is further reduced. For example, the bus efficiency at the operation frequency of 100 MHz during data transfer in the DDR mode is for example a little more than 0.4, and the bus utilization efficiency is about 0.3 when the operation frequency is 125 MHz. At the operation frequency of 166 MHz or 200 MHz, the clock cycle number of each of column latency CL, RAS–CAS delay time tRCD and RAS precharge time tRP increases, the number of clock cycles during which data is not transferred increases, and the bus utilization efficiency becomes a little more than about 0.2, which is about half that in the case of the operation frequency of 100 MHz.

Therefore, even when a plurality of banks are provided and data is transferred in a bank interleaved manner, data is randomly accessed, and if different rows in the same bank are consecutively accessed the overhead in page switching is more disadvantageously affected as the operation frequency increases, whereby the bus utilization efficiency is disadvantageously reduced.

SUMMARY OF THE INVENTION

An object of the present invention is to provide a semiconductor memory device capable of reducing a penalty in page (row) switching within the same bank.

Another object of the present invention is to provide a semiconductor memory device capable of preventing a reduction in bus utilization efficiency when the same bank is consecutively accessed.

The semiconductor memory device according to the present invention includes a plurality of memory cells arranged in a matrix, and a plurality of sense amplifier circuits arranged corresponding to columns for sensing, amplifying and latching data of memory cells of the corresponding columns when activated. The plurality of sense amplifier circuits are divided into a plurality of groups.

The semiconductor memory device according to the present invention further includes connection circuitry responsive to a row selection designation and a sense amplifier group designation for separating a sense amplifier circuit of the designated sense amplifier group and a corresponding column when a prescribed period of time is elapsed after the row selection designation is applied. The prescribed period of time includes a period in which data of memory cells of the selected row is transmitted to the corresponding sense amplifier circuits.

The semiconductor memory device according to the present invention further includes sense control circuitry for activating sense amplifier circuits of the sense amplifier group designated by the sense amplifier group designation when the prescribed period of time is elapsed.

A semiconductor memory device according to another aspect of the present invention includes a memory array including a plurality of memory cells arranged in rows and columns, and a plurality of sense amplifiers arranged corresponding to the columns of the memory array for sensing, amplifying and latching memory cell data of the corresponding columns when activated. A plurality of sense amplifier circuits are provided corresponding to the columns. The stored data of a memory cell of the memory array can be sensed by any of a plurality of sense amplifier circuits of the corresponding column.

Provision of the plurality of sense amplifier circuits corresponding to each column enables memory cell data of different rows to be retained in the corresponding sense amplifier circuits for each column. Accordingly, with the sense amplifier circuits and the corresponding columns isolated, memory cell data of the different row can be sensed, amplified and latched by another sense amplifier circuit while accessing one sense amplifier circuit. Thus, by accessing the sense amplifier circuit with each column and an associated sense amplifier circuit isolated, memory cell data of different rows can consecutively be accessed, whereby a penalty in page switching in the same bank can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 26A and 26B are timing charts representing data reading operations of a conventional semiconductor memory device.

DESCRIPTION OF THE PREFERRED EMBODIMENTS

First Embodiment

Figure 1:
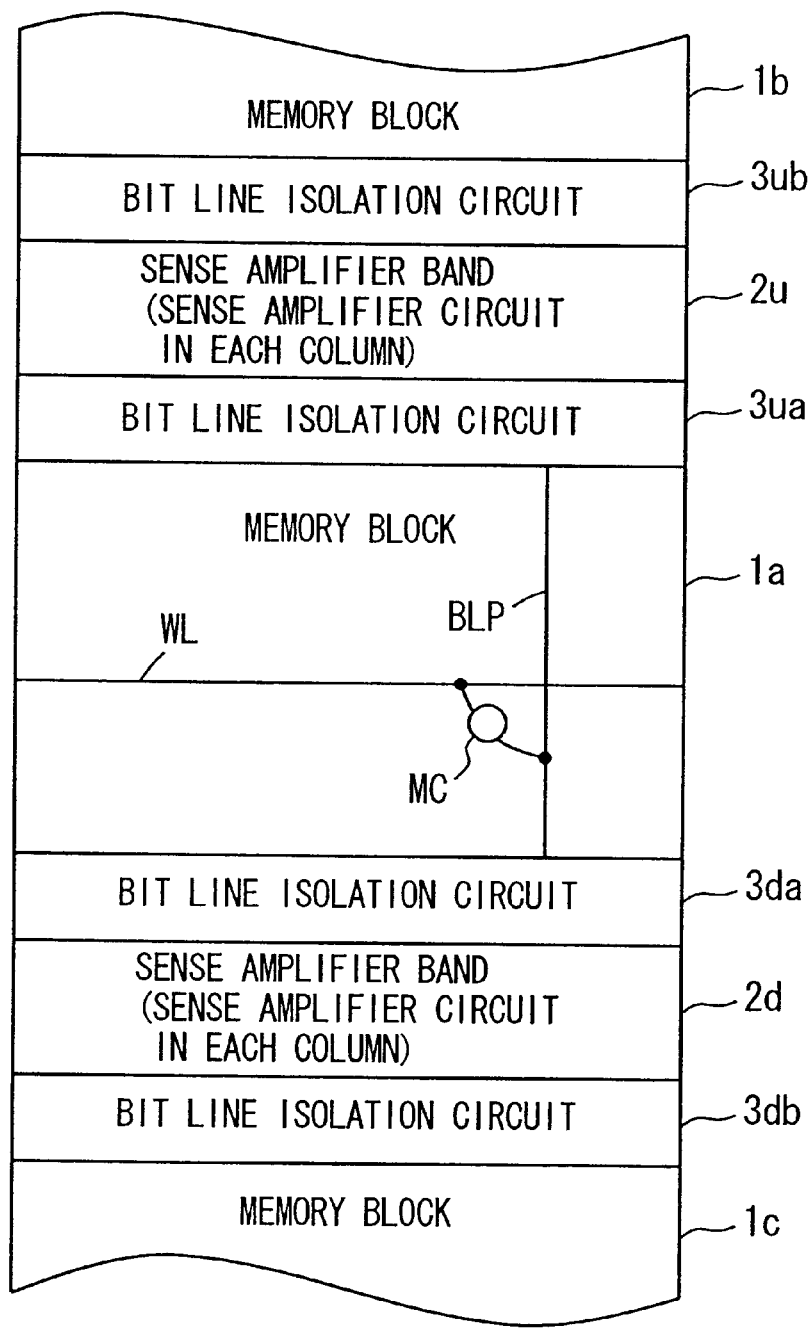
FIG. 1 is a diagram schematically showing an arrangement of an array portion of a semiconductor memory device according to a first embodiment of the present invention.

FIG. 1 is a diagram schematically showing an arrangement of an array portion of the semiconductor memory device according to the first embodiment of the present invention. Referring to FIG. 1, the memory array is divided into a plurality of memory blocks. FIG. 1 shows an arrangement of the portion associated with a memory block 1a. Memory block 1a includes: a plurality of memory cells MC arranged in rows and columns word lines WL arranged corresponding to respective rows of memory cells MC and each connected to memory cells MC in a corresponding row; and a plurality of bit line pairs BLP arranged corresponding to respective columns of memory cells MC and each connected to the memory cells in a corresponding column. FIG. 1 representatively shows one word line WL, one bit line pair BLP, and memory cell MC arranged corresponding to an intersection of word line WL and bit line pair BLP.

Sense amplifier bands 2u and 2d are arranged on either side of memory block 1a in the column direction. Sense amplifier band 2u includes sense amplifier circuits arranged corresponding to columns (bit line pairs BLP) of memory block 1a. Similarly, sense amplifier band 2d includes sense amplifier circuits arranged corresponding to columns (bit line pairs BLP) of memory block 1a. In other words, sense amplifier circuits are arranged at both ends of bit line pairs BLP of memory block 1a.

A bit line isolation circuit 3ua is arranged between memory block 1a and sense amplifier band 2u, whereas a bit line isolation circuit 3da is arranged between memory block 1a and sense amplifier band 2d. Sense amplifier band 2u is connected to a memory block 1b through bit line isolation circuit 3ub, whereas sense amplifier band 2d is connected to a memory block 1c through bit line isolation circuit 3db.

When a row (a word line) is designated in memory block 1a, one of sense amplifier bands 2u and 2d senses, amplifies and latches data of the memory cells in the selected row. During a sensing operation, the corresponding bit line isolation circuit is brought into a non-conductive state, and a so-called "electric charge confined sensing operation" is performed. Thus, the sensing operation can be performed at a higher speed.

Sense amplifier circuits are arranged in sense amplifier bands 2u and 2d corresponding to respective columns of memory block 1a. Thus, data of memory cells in different rows within memory block 1a can be latched in sense amplifier bands 2u and 2d. For example, the memory cell data in a first row of memory block 1a is latched by sense amplifier band 2u, and the data of sense amplifier band 2u is accessed. In the data access, memory block 1a is brought back to a precharged state, another second row is selected, and data of the memory cells connected to the second row is sensed, amplified and latched by sense amplifier band 2d. Accordingly, after data of sense amplifier band 2u is accessed, the data of sense amplifier band 2d is accessed, so that data can consecutively be accessed without causing any penalty in page switching. In addition, even if page switching occurs within the same bank, the data transfer operation is not interrupted.

Figure 2:
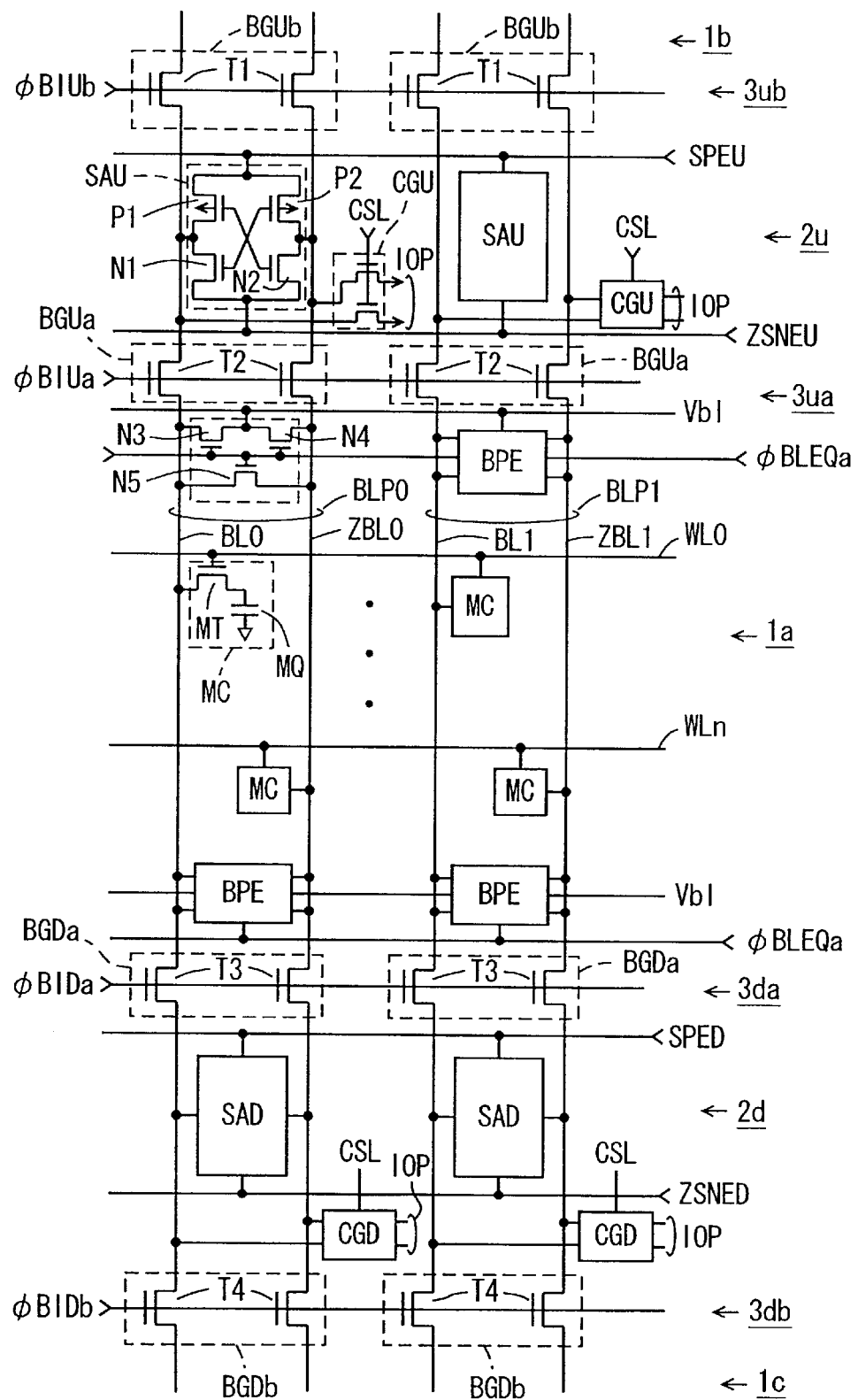
FIG. 2 is a diagram showing in detail an arrangement of the array portion shown in FIG. 1.

FIG. 2 is a diagram showing in greater detail an arrangement of the array portion shown in FIG. 1. FIG. 2 shows a portion related to two bit line pairs BLP0 and BLP1 of memory block 1a.

Word lines WL0 to WLn are arranged corresponding to respective rows of memory cells MC. Bit line pair BLP0 includes a pair of bit lines BL0 and BL0, whereas bit line pair BLP1 includes bit line pairs BL1 and ZBL1. Memory cell MC is arranged corresponding to a crossing of word line line WL and bit lines BL0, BL1 as well as a crossing of word line WLn and bit lines ZBL0, ZBL1. Memory cell MC includes a capacitor MQ for storing information, and an access transistor MT including an N channel MOS transistor rendered conductive in response to a signal potential on the corresponding word line for connecting memory capacitor MQ to the corresponding bit line.

Further, in memory block 1a, bit line precharge/equalize circuits BPE are arranged on either side of each of bit line pairs BLP0 and BLP1, and are activated in response to a bit line equalize instruction signal φBLEQa for precharging and equalizing the corresponding bit line pairs to an intermediate voltage Vb1. The provision of bit line precharge/equalize circuits BPE on either side of each of bit line pairs BLP0 and BLP1 reduces the time required for precharging each bit line pair. In the present invention, especially, bit line pair BLP (BLP0, BLP1, . . . ) is connected over the entire memory blocks through the bit line isolation circuit in a stand-by mode. Accordingly, to avoid a variation in potential of the bit line pair over the entire memory array, bit line equalize circuits are arranged on either side of the bit line pair in each memory block, so that the bit line pair is surely precharged and equalized to a prescribed voltage level of intermediate voltage Vb1.

Bit line precharge/equalize circuit BPE includes: N channel MOS transistors N3 and N4 rendered conductive in response to activation (H level) of bit line equalize instruction signal φBLEQa for transmitting intermediate voltage Vb1 respectively to bit lines BL (BL0, BL1, . . . ) and ZBL (ZBL0, ZBL1, . . . ); and N channel MOS transistor N5 rendered conductive upon activation of bit line equalize instruction signal φBLEQa for electrically short-circuiting bit lines BL and ZBL.

In the first embodiment, activation/inactivation of bit line precharge/equalize circuit BPE is performed for each memory block.

Sense amplifier band 2u includes sense amplifier circuits SAU arranged corresponding to respective bit line pairs BLP0, BLP1, and such. Sense amplifier circuit SAU includes cross-coupled P channel MOS transistors P1 and P2, and cross-coupled N channel MOS transistors N1 and N2. Sense amplifier circuit SAU is activated in response to activation of sense amplifier activation signals SPEU and ZSNEU. Sense amplifier activation signals SPEU and ZSNEU are transmitted through a sense amplifier activation transistor which is rendered conductive in response to activation of a sense amplifier driving signal and attain to power supply voltage and ground voltage levels when activated, respectively. The sense amplifier activation transistor is arranged corresponding to a prescribed number of sense amplifier circuits.

Bit lines isolation circuit 3ua includes a bit line isolation gates BGUa arranged between bit line pairs BLP0, BLP1, . . . and corresponding sense amplifier circuits SAU. Bit line isolation gate BGUa includes a transfer gate T2 formed of an N channel MOS transistor arranged for each of corresponding bit lines BL and ZBL.

Bit line isolation circuit 3ub includes a bit line isolation gate BGUb arranged between each bit line pair and sense amplifier circuit SAU of memory block 1b. Bit line isolation gate BGUb includes a transfer gate T1 formed of an N channel MOS transistor arranged corresponding to each bit line. Bit line separation circuit 3ua is rendered conductive in response to a bit line isolation control signal φBIUa, whereas bit line isolation circuit 3ub is rendered conductive in response to a bit line isolation control signal φBIUb.

Bit line isolation circuit 3da includes a bit line isolation gate BGDa arranged corresponding to each of bit line pairs BLP0, BLP1, . . . Bit line isolation gate BGDa is arranged corresponding to each bit line of the corresponding bit line pair, and includes a transfer gate T3 formed of an N channel MOS transistor which is rendered conductive in response to a bit line isolation control signal φBIDa.

Bit line isolation circuit 3db includes a bit line isolation gate BGDb arranged corresponding to each bit line pair of memory block 1c. Bit line isolation gate BGDb includes a transfer gate T4 formed of an N channel MOS transistor which is rendered conductive in response to a bit line isolation control signal φBIDb for connecting each bit line of the corresponding bit line pair to a sense amplifier circuit included in the corresponding sense amplifier band 2d.

Sense amplifier band 2d includes a sense amplifier circuit SAD arranged between bit line isolation gates BGDa and BGDb. Sense amplifier circuit SAD is activated upon activation sense amplifier activation signals SPED and ZSNED.

Figure 3:
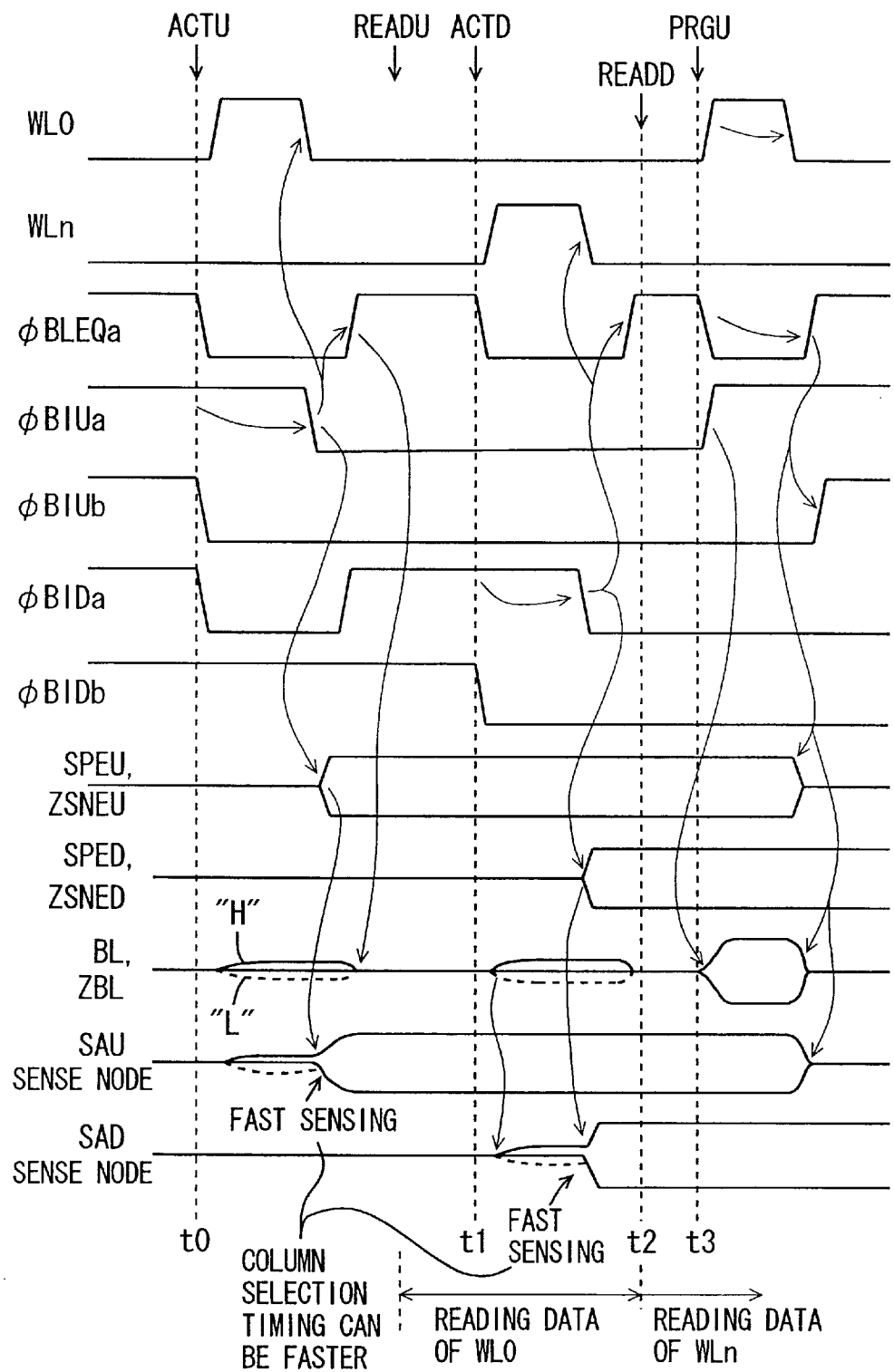
FIG. 3 is a diagram showing signal waveforms related to an operation of the semiconductor memory device shown in FIG. 2.

A column selection gate CGU is arranged corresponding to sense amplifier circuit SAU and connects sense nodes of the corresponding sense amplifier circuit to an internal data line pair IOP in response to column selection signal CSL. In addition, a column selection gate CGD is arranged corresponding to each sense amplifier circuit SAD. The internal data lines connected to column selection gates CGU and CGD are changed according to an array arrangement (this will be described later). Column selection signal CSL applied to column selection gates CGU and CGD may be the same or different (this also varies according to the array arrangement). Now, an operation of the semiconductor memory device shown in FIG. 2 will be described with reference to a signal waveform diagram shown in FIG. 3.

An operation of accessing a memory cell on word line WL0 in memory block 1a and then accessing a memory cell on word line WLn will be described.

Here, assume that all of memory blocks 1a–1c are in the precharge state, bit line isolation circuits 3ua, 3ub, 3da and 3db are all in the conductive state, bit line equalize instruction signal φBLEQa is in the active state, and bit line pairs BLP0, BLP1, . . . are precharged to intermediate voltage Vb1. Sense amplifier circuits SAU and SAD are in the inactive state.

At a time t0, an active command ACTU for selecting word line WL0 of memory block 1a is applied. Active command ACTU includes information as to which one of sense amplifier bands arranged on either side of memory block 1a in the column direction is to sense the data (an arrangement for generating the sense amplifier designation information will be described later). When active command ACTU is applied, word line WL0 is designated in accordance with simultaneously applied row address signal RA. Row address signal RA includes information designating memory block 1a. In accordance with the sense amplifier band designation information and memory block designation information, bit line isolation control signals φBIUb and φBIDa are brought into the inactive state and bit line isolation circuits 3ub and 3da are brought into the non-conductive state. Thus, memory block 1a is connected to sense amplifier band 2u and isolated from sense amplifier band 2d.

When word line WL0 is driven into the selected state by row selection circuitry (not shown), data of memory cells MC connected to word line WL0 are read onto the corresponding bit line pairs BLP0, BLP1, and then transmitted to sense nodes of sense amplifier circuits SAU through bit line isolation circuit 3ua. When a voltage change at the sense nodes of sense amplifier circuit SAU becomes sufficiently large, bit line isolation control signal φBIUa and bit line isolation circuit 3ua are brought into the non-conductive state.

When bit line isolation control signal 4BIUa is brought into the inactive state, sense amplifier activation signals SPEU and ZSNEU are driven into the active state, and memory cell data which has been transmitted to the sense nodes of sense amplifier circuit SAU is amplified and latched by sense amplifier circuit SAU. Sense amplifier band 2u is isolated from memory blocks 1a and 1b and, accordingly, a load of sense amplifier circuit SAU is small and a memory cell data is sensed and latched at a high speed. When bit line isolation control signal φBIUa is driven into the inactive state during the sensing operation, word line WL0 in the selected state is driven into the non-selected state, bit line equalize instruction signal φBLEQa is driven into the active state, and bit line pairs BLP0, BLP1, . . . of memory block 1a are again precharged to intermediate voltage Vb1. Therefore, in this state, stored data of memory cell MC connected to word line WL0 is in a destructed state.

In this state, a read command READU instructing data reading is applied. Read command READU includes information designating a sense amplifier band. Column selection signal CSL is driven into the active state in accordance with the simultaneously applied column address and sense amplifier band designating information, so that latching data of sense amplifier circuit SAU corresponding to the addressed column is read.

During the data reading, active command ACTD is again applied for designating word line WLn. Bit line equalize instruction signal φBLEQa is again driven into the inactive state in accordance with active command ACTD. Bit line isolation control signals φBIUi and φBIUb are maintained in the inactive state, and bit line isolation circuits 3ub and 3ua are maintained in the non-conductive state. On the other hand, since sense amplifier band 2d is designated in accordance with active command ACTD, bit line isolation control signal φBIDb is driven into the inactive state, bit line isolation circuit 3db is brought into the non-conductive state, and sense amplifier band 2d is isolated from memory block 1c. Sense amplifier circuits SAU of sense amplifier band 2u are maintained in the active state.

Thereafter, word line WLn is driven into the selected state. When data of the memory cells connected to word line WLn are transmitted to the sense nodes of sense amplifier circuits SAD of sense amplifier band 2d and the voltage thereof become sufficiently high, bit line isolation control signal φBIDa is driven into the inactive state and bit line isolation circuit 3da is brought into the non-conductive state. In this state, sense amplifier activation signals SPED and ZSNED are activated, sense amplifier circuit SAD performs the sensing operation for sensing, amplifying and latching the transmitted memory cell data. Thus, the sensing operation can be performed while being separated from memory blocks 1a and 1c, and the memory cell data can be sensed, amplified and latched at a high speed.

When bit line isolation control signal φBIDa is driven into the inactive state, word line WLn in the selected state is driven into the non-selected state, bit line equalize instruction signal φBLEQa is driven into the active state, and bit line pairs BLP0, BLP1, . . . are again precharged to intermediate voltage Vb1 by bit line precharge/equalize circuit BPE in memory block 1a.

At a time t2, a read command READD instructing data reading with respect to sense amplifier band 2d is applied. In response to read command READD, a column selection signal is generated in accordance with the simultaneously applied column address signal, and data of word line WLn which is latched by sense amplifier band 2d is read in accordance with column selection signal CSL. At a time t3, as data reading with respect to sense amplifier band 2u has been completed, a precharge command PRGU with respect to sense amplifier band 2u is applied. When precharge command PRGU is applied, a row address of the memory cells that have data latched by sense amplifier band 2u is simultaneously applied.

Thus, when precharge command PRGU is applied, first, bit line equalize instruction signal φBLEQa is driven into the inactive state for a prescribed period of time and, successively, bit line isolation control signal +BIUa is driven into the inactive state of an H level, bit line isolation circuit 3ua is rendered conductive, and data of the memory cells connected to the corresponding bit line pairs BLP0, BLP1, . . . of memory block 1a are stored by sense amplifier circuits SAU. When a prescribed period of time elapsed, the voltage of word line WL0 falls to an L level, bit line equalize instruction signal φBLEQa is driven into the active state, sense amplifier activation signals SPEU and ZSNEU are driven into the inactive state, and sense amplifier circuit SAU is also driven in the inactive state. The sense nodes of sense amplifier circuits SAU are precharged to intermediate voltage Vb1, and bit line pairs BLP0, BLP1, . . . are also precharged to intermediate voltage Vb1. After activation of bit line equalize instruction signal φBLEQa, bit line isolation control signal φBIUa is brought into the inactive state of the H level, bit line isolation circuit 3ub is rendered conductive, and memory block 1b is connected to sense amplifier band 2u.

When precharge command PRGU is applied, the memory cell data is restored. As a result, the restoring period is longer than the time required for a general precharging operation. However, the precharging operation by precharge command PRGU is performed in parallel with the data reading operation by read command READD, so that the restoring operation can be hidden by the data reading operation and accessing operation is not adversely affected.

Figure 4:
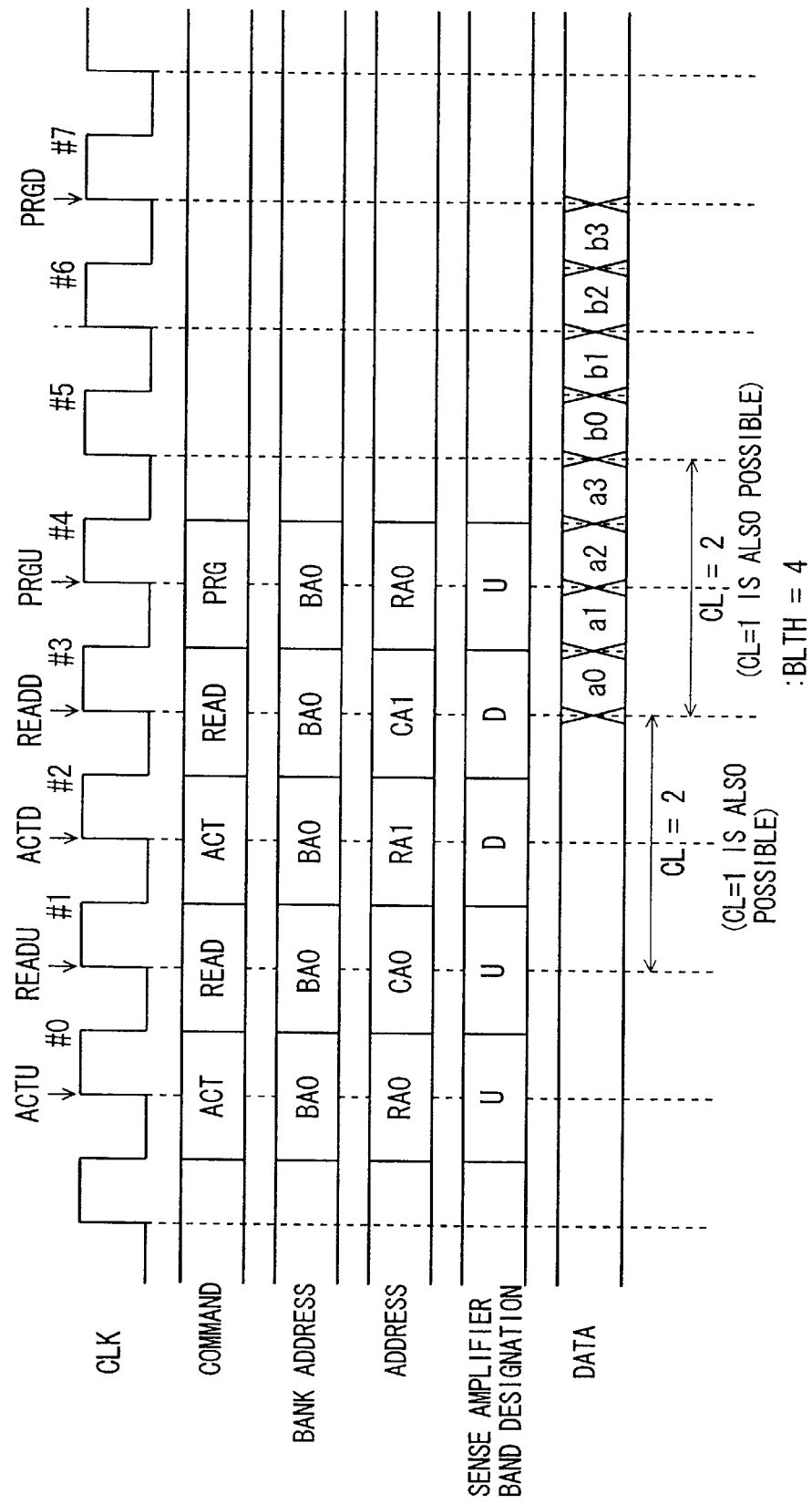
FIG. 4 is a diagram showing an application sequence of an external signal of the semiconductor memory device according to the first embodiment of the present invention.

FIG. 4 is a diagram showing an exemplary application sequence of an external signal of the semiconductor memory device according to the first embodiment of the present invention. Referring to FIG. 4, in a cycle #0 of clock signal CLK, active command ACTU is applied. Active command ACTU includes a row access command ACT instructing a row selection operation, a bank address BA0 designating a bank for row access, an address RA0 designating a row in the bank, and a sense amplifier band designation bit U designating a sense amplifier band on the upper side of the memory block in the column direction.

Address RA0 includes a bit designating a memory block and a bit designating a row of the designated memory block, i.e., it includes both of block and row addresses. Sense amplifier band designation bit U is generated as follows: a memory controller monitors the access condition in the semiconductor memory device and designates an unused sense amplifier band (this will later be described). The row selection operation is performed in a bank BK0 designated by a bank address BA0 in accordance with active command ACTU, memory cell data of the selected row are transmitted to the corresponding sense amplifier band and, successively, the sense amplifier band and the memory block are isolated for the sensing operation and the memory cell data is latched.

Successively, in a cycle #1 of clock signal CLK, a read command READU is applied. Read command READU includes read command READ instructing data reading, bank address BA0 designating the bank for data reading, and a column address CA0 indicating a selected column. At the time, a sense amplifier band designation U indicating one of two sense amplifier bands on which the column selection is to be performed is applied. When read command READ is applied to the memory block that is designated by active command ACTU, the sense amplifier circuit corresponding to the selected column of the sense amplifier band is connected to a data bus connected to a writing/reading circuit (the connection will also be described afterwards). Now, assume that column latency CL is 2 in data reading. The data of the sense amplifier is transmitted to an output circuit from the internal data bus through the reading circuit, and the data is read in accordance with rising and falling edges of clock signal CLK starting at clock cycle #3. Burst length BTLH is 4, and data a0–a3 are sequentially read.

In clock cycle #2, active command ACTD is applied. Active command ACTD also accompanies bank address BA0 designating bank BK0, and a different row in the same memory block is designated in accordance with an address RA1. When the designated memory block is the same or adjacent one, if the sense amplifier band designated by sense amplifier band designation bit U is used, sense amplifier band designation bit D is further applied to indicate an unused sense amplifier band. Thus, data of the memory cells in the row designated by address RA1 in the memory block are sensed, amplified and latched by sense amplifier circuits of the sense amplifier band designated by sense amplifier band designation bit D.

In clock cycle #3, read command READD is applied. Concurrently, bank address is also BA0 and column address CA1 and sense amplifier band designation D are applied. When the data of the sense amplifier band designated by sense amplifier band designation bit U is read, the sense amplifier band designated by sense amplifier designation bit D is connected to the internal data bus for data reading. In this case, similarly, column latency CL is 2, and data b0–b3 are sequentially read in synchronization with rising and falling edges of clock signal CLK from the sense amplifier band designated by sense amplifier band designation bit D, starting from clock cycle #5.

In a clock cycle #4, precharge command PRGU is applied. When precharge command PRGU is applied, precharge command PRG instructing the precharging operation as well as bank address BA and row address RA0 are applied along with sense amplifier band designation bit U. Thus, after the data retained in the sense amplifier circuits of the sense amplifier band designated by sense amplifier band designation bit U are rewritten to the corresponding memory cells in accordance with the precharge command PRGU, the selected memory block is brought back to the precharge state. The memory cell data that have been latched by the sense amplifier band designated by sense amplifier band designation bit D are rewritten in accordance with precharge command PRGD at an appropriate timing in the present embodiment (in FIG. 4, precharge command PRGD is applied in a clock cycle #7).

Referring to the timing chart shown in FIG. 4, when active command ACT is applied, a command for performing column selection in the next clock cycle can be applied. This is because the sensing operation is performed with the sense amplifier band and the memory block isolated, a load of the sense amplifier circuit is small for high speed sensing operation, and the column selection timing can be faster. Accordingly, data can be read with column latency CL being equal to 1.

Figure 5:
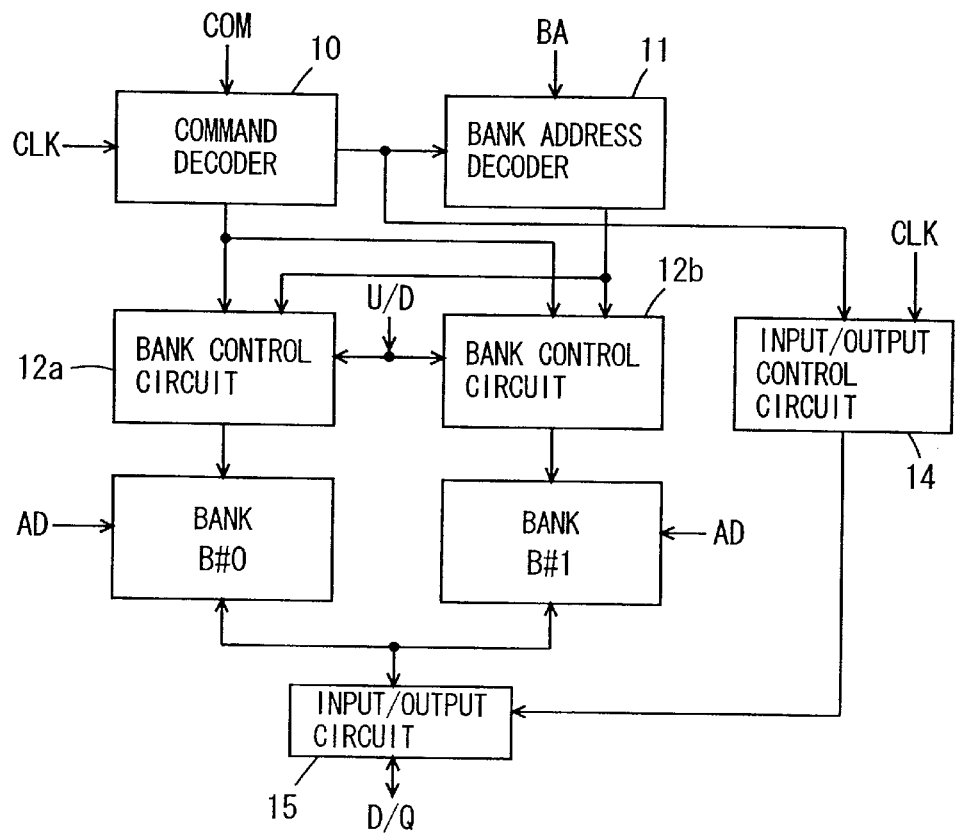
FIG. 5 is a diagram schematically showing an overall arrangement of the semiconductor memory device according to the first embodiment of the present invention.

FIG. 5 is a diagram schematically showing an overall arrangement of the semiconductor memory device according to the first embodiment of the present invention. Referring to FIG. 5, the semiconductor memory device according to the first embodiment includes two banks B#0 and B#1. Banks B#0 and B#1 can have rows driven into the selected state independently from each other. Each of banks B#0 and B#1 has an arrangement of the memory array shown in FIGS. 1 and 2.

The semiconductor memory device further includes: a command decoder 10 incorporating a command COM externally applied in synchronization with clock signal CLK for generating a decode signal indicating a designated operation mode; a bank address decoder 11 decoding bank address BA in accordance with the operation mode designation or control signal from command decoder 10; bank control circuits 12a and 12b arranged corresponding to banks B#0 and B#1 respectively for performing designated operations on corresponding banks B#0 and B#1 in accordance with a decode signal (an operation mode designation signal) from command decoder 10 and a bank designation signal from bank address decoder 11; an input/output circuit 15 shared by banks B#0 and B#1 for externally inputting/outputting data D/Q; and an input/output control circuit 14 controlling an operation of input/output circuit 15 when the operation mode designation signal from command decoder 10 indicates that the data input/output designation (a read command or a write command) has been applied.

Sense amplifier band designation bit U/D is applied to bank control circuits 12a and 12b, and connection between the designated sense amplifier band and the memory block as well as data access are controlled. Input/output control circuit 14 controls a data input/output operation of input/output circuit 15 in synchronization with clock signal CLK.

Figure 6:
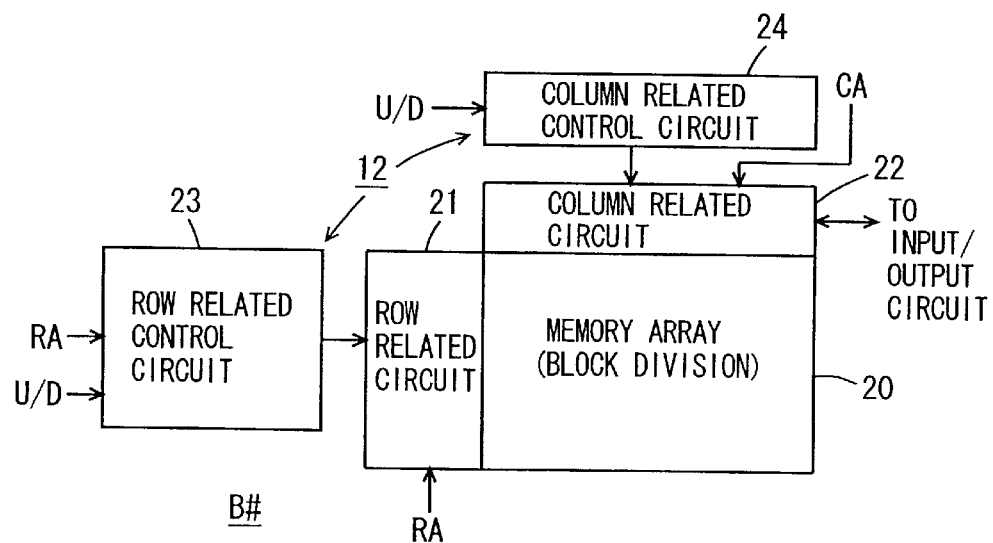
FIG. 6 is a diagram schematically showing an arrangement of a bank shown in FIG. 5.

FIG. 6 is a diagram schematically showing arrangements of banks B#0 and B#1 shown in FIG. 5. Since banks B#0 and B#1 have the same arrangement, FIG. 6 generally shows a bank B#.

Referring to FIG. 6, bank B# includes: a memory array 20 having a block division (partially activation) structure; a row related circuit 21 performing an operation related to row selection in memory array 20; a column related circuit 22 performing an operation related to column selection in memory array 20; a row related control circuit 23 controlling an operation of row related circuit 21; and a column related control circuit 24 controlling an operation of column related circuit 22. These row related control circuit 23 and column related control circuit 24 form a bank control circuit 12 (12a or 12b).

Row address signal RA and sense amplifier band designation bit U/D are applied to row related control circuit 23. This is because the connection between the selected block and the sense amplifier band as well as activation of the sense amplifier band must be controlled in the row selection operation.

Row related circuit 21 includes: a row selection circuit including a row decoder decoding address signal RA and a word line driving circuit driving a word line into the selected state in accordance with an output signal from the row decoder; a sense amplifier circuit; and circuitry including a bit line precharge/equalize circuit operating when the active command is applied. Column related circuit 22 includes a column selection gate, a column decoder, a preamplifier amplifying internally read data to an input/output circuit, a write driver amplifying write data applied from input/output circuit 15 for transferring it to a selected memory cell (a selected sense amplifier) and the like. Column related circuit 22 further includes a data bus connecting circuit connecting an internal data line and the sense amplifier band.

It is noted that, while not clearly shown in FIG. 6, address signals RA and CA are generated by an address latch circuit latching a signal applied from an address buffer which operates in synchronization with clock signal CLK under control of command decoder 10.

Figure 7:
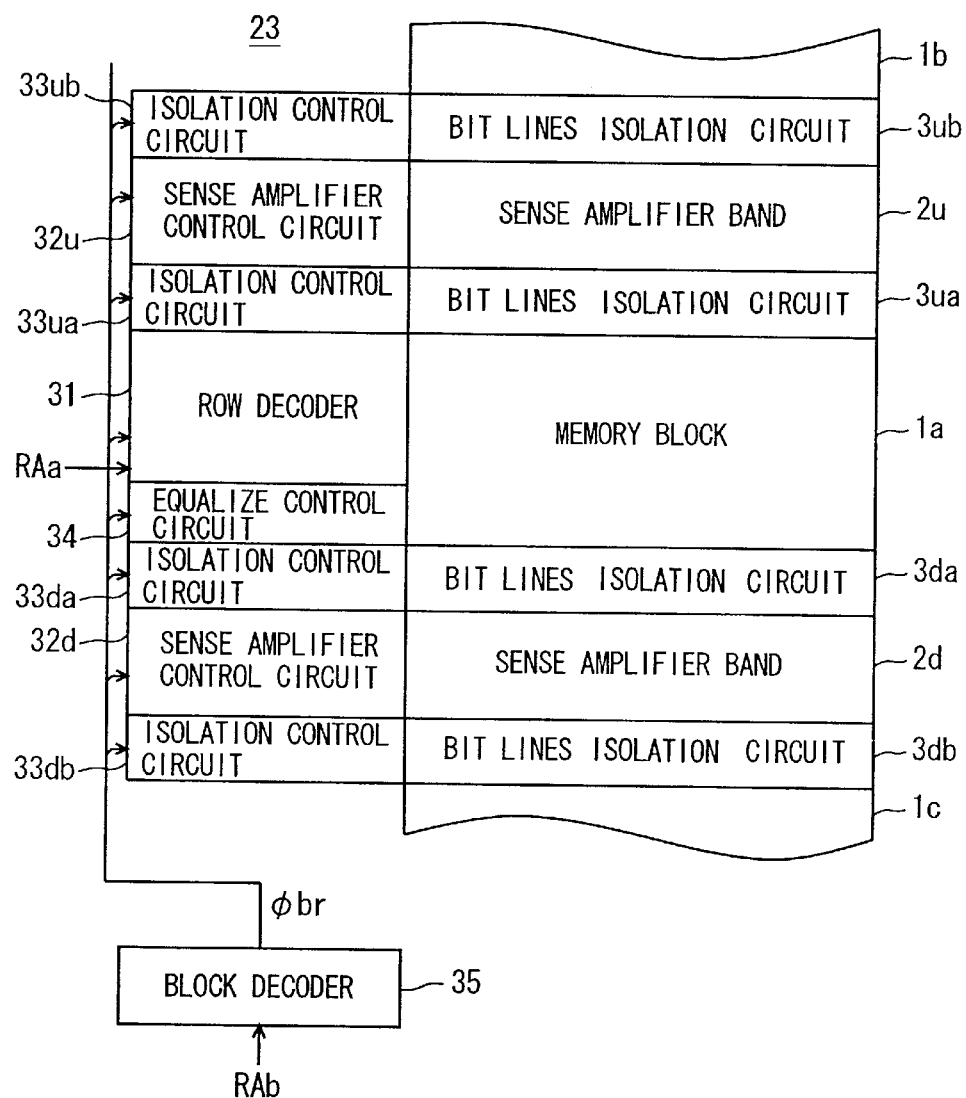
FIG. 7 is a diagram schematically showing an arrangement of a row related control circuit shown in FIG. 6.

FIG. 7 is a diagram schematically showing an arrangement of row related control circuit 23 shown in FIG. 6. Referring to FIG. 7, isolation control circuits 33ub, 33ua, 33da, and 33db are arranged corresponding to bit line isolation circuits 3ub, 3ua, 3da, and 3db, respectively. Further, sense amplifier control circuits 32u and 32d are arranged corresponding to sense amplifier bands 2u and 2d, respectively. An equalize control circuit 34 is provided to control a bit line precharge/equalize circuit included in memory block 1a. These isolation control circuits 33ua, 33ub, 33da, and 33db, sense amplifier control circuits 32u and 32d, as well as equalize control circuit 34 are included in row related control circuit 23. A row decoder 31 is provided for memory block 1a for driving a word line in memory block 1a to the selected state.

A block selection signal φbr is applied from block decoder 35 to row related control circuit 23, and a circuit related to the designated memory block is activated for performing a prescribed operation. Block decoder 35 decodes a prescribed number of bits RAb of row address signal RA for generating a block selection signal. Row decoder 31 is activated when memory block 1a is designated by block selection signal φbr for decoding an X address RAa and driving a word line corresponding to the addressed row into the selected state.

It is noted that bit line isolation circuits 3ub, 3ua, 3da, and 3db, sense amplifier bands 2u and 2d, as well as a bit line precharge/equalize circuit (not shown) are included in row related circuit 21.

Figure 8:
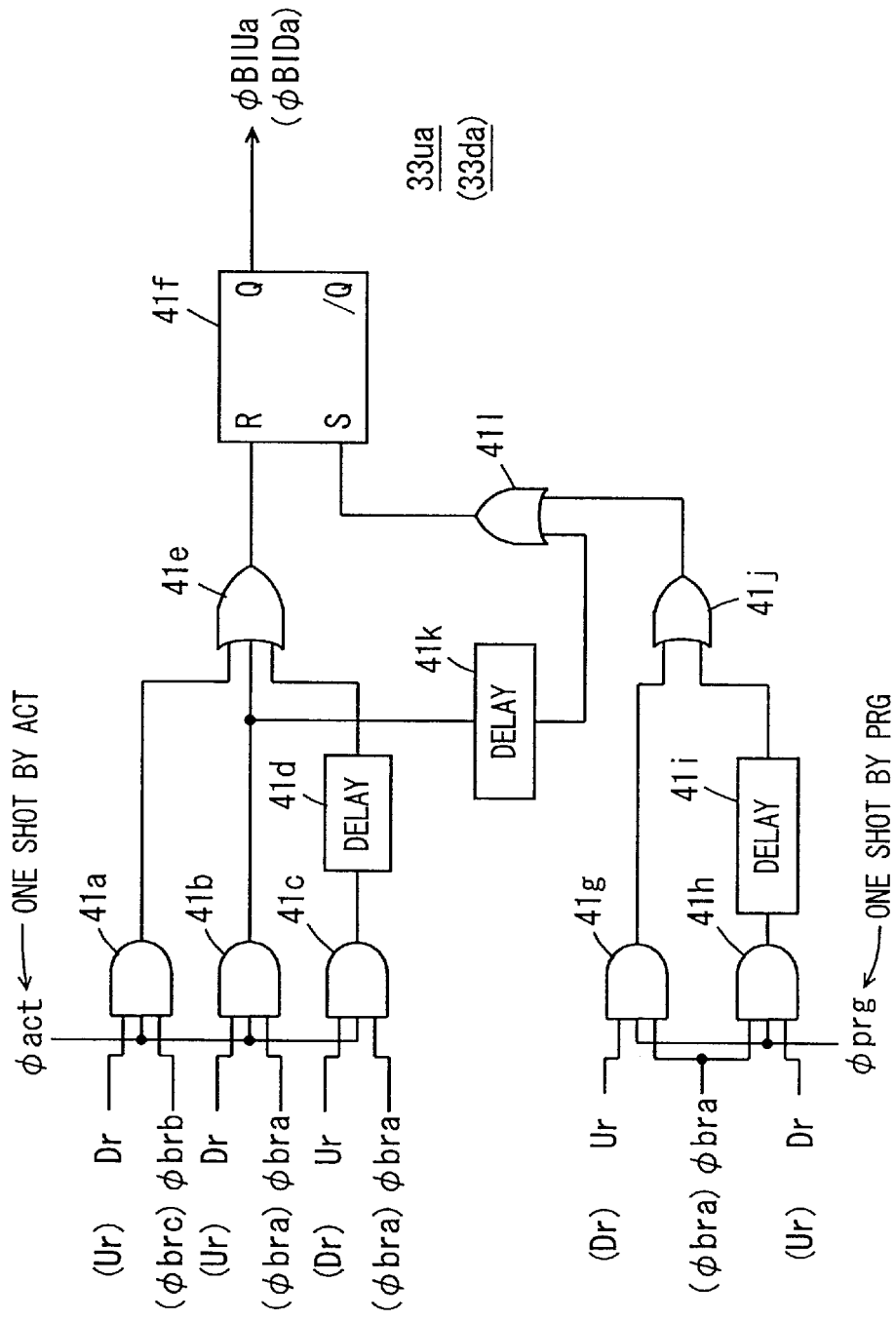
FIG. 8 is a diagram showing an exemplary arrangement of an isolation control circuit shown in FIG. 7.

FIG. 8 is a diagram showing an exemplary arrangement of separation control circuit 33ua shown in FIG. 7. Referring to FIG. 8, isolation control circuit 33ua includes an AND circuit 41a receiving a sense amplifier band designation signal Dr generated from sense amplifier band designation bit U/D, a row selection operation activation designation signal fact generated in a one-shot pulse form upon application of active command ACT, and a block designation signal φbrb designating memory block 1b from block decoder 35 shown in FIG. 7; an AND circuit 41b receiving sense amplifier band designation signal Dr, row related operation activation designation signal fact, and a block designation signal φbra designating memory block 1a; an AND circuit 41c receiving sense amplifier band designation signal Ur, block designation signal φbra, and row selection operation activation designation signal φact; a delay circuit 41d delaying an output signal from AND circuit 41c by a prescribed period of time; an OR circuit 41e receiving output signals from AND circuits 41a and 41b as well as an output signal from delay circuit 41d; and a set/reset flip-flop 41f reset in response to the rise of the output signal from OR circuit 41e. A bit line isolation control signal φBIUa with respect to bit line isolation circuit 3ub is output from an output Q of set/reset flip-flop 41f. The delay time of delay circuit 41d corresponds to a period of time after row selection till transmission of data of the selected memory cell to the sense amplifier band.

Isolation control circuit 33ua further includes: an AND circuit 41g receiving a precharge operation instruction signal φprg activated in a one-shot pulse form upon application of precharge command PRG, sense amplifier band designation signal Ur, and a block designation signal φbra; an AND circuit 41h receiving precharge operation instruction signal φprg, block designation signal φbra, and sense amplifier band designation signal Dr; a delay circuit 41i delaying an output signal from AND circuit 41h by a prescribed period of time; an OR circuit 41j receiving output signals from AND circuit 41g and delay circuit 41i; a delay circuit 41k delaying an output signal from AND circuit 41b by a prescribed period of time; and an OR circuit 41e receiving output signals from delay circuit 41k and OR circuit 41j. In response to the rise of the output signal from OR circuit 41l, set/reset flip-flop 41f is set, and bit line isolation control signal φBIUa rises to the H level.

Sense amplifier band designation signal Dr designates the sense amplifier band provided on the lower side of the memory block in the column direction, whereas sense amplifier band designation signal Ur designates the sense amplifier band provided on the upper side of the memory block in the column direction.

In the stand-by mode, set/reset flip-flop 41f is in the set state, and bit line isolation control signal φBIUa is maintained at the H level (a high voltage level).

When active command ACT is applied, column selection operation activation instruction signal fact is brought into the active state for a prescribed period of time. Block selection signal φbr designating the memory block in accordance with the simultaneously applied address signal RA is output from block decoder 35. Now, assume that memory block 1a is designated and the operation of retaining the memory cell data in sense amplifier band 2u is designated. In this state, block designation signal φbra attains to the H level, and sense amplifier band designation signal Ur also attains to the H level. Accordingly, when output signals from AND circuit 41c and delay circuit 41d attain to the H level, set/reset flip-flop 41f is reset in response to the rise of the output signal from OR circuit 41e, bit line isolation control signal φBIUa attains to the L level, and sense amplifier band 2u and memory block 1a are isolated. In other words, a word line is selected by delay circuit 41d and a time required for data of the memory cell connected to the selected word line to be transmitted to sense amplifier band 2u is assured.

On the other hand, when memory block 1a is designated and data latched by sense amplifier band 2d is designated, block designation signal φbra and sense amplifier band designation signal Dr are activated. The output signal from AND circuit 41b attains to the H level and, in response to activation of row selection operation activation instruction signal φact, set/reset flip-flop 41f is reset in accordance with an output signal from OR circuit 41b before word line selection. Thus, bit line isolation control signal φBIUa attains to the L level, and memory block 1a and sense amplifier band 2u are isolated. In this state, the memory cell data is sensed, amplified and latched by sense amplifier band 2d.

On the other hand, when a delay time caused by delay circuit 41k is elapsed, an output signal from OR circuit 41l attains to the H level, set/reset flip-flop 41f is set, bit line isolation control signal φBIUa attains to the H level, and sense amplifier band 2u is connected to memory block 1a. In this state, next column selection can be performed on memory block 1a.

When latching of the data of memory block 1b by sense amplifier band 2u is designated, block designation signal φbrb and sense amplifier band designation signal Dr are activated, and the output signal from AND circuit 41a attains to the H level. Accordingly, in this state, set/reset flip-flop 41f is reset in accordance with the output signal from OR circuit 41e, bit line isolation control signal 4BIUa attains to the L level, and sense amplifier band 2u and memory block 1a are isolated. Thus, data of memory block 1b is sensed, amplified and latched by sense amplifier band 2u.

In a precharging operation, a sense amplifier band designation bit and a row address are applied along with a precharge command. When sense amplifier band designation signal Ur and block designation signal. φbra both attain to the H level, precharge of the data latched by sense amplifier band 2u is designated. Thus, in this case, a restoring operation must be performed. When the output signal from AND circuit 41g attains to the H level, set/reset flip-flop 41f is set by OR circuits 41j and 41l, bit line isolation control signal φBIUa attains to the H level, and sense amplifier and 2u and memory block 1a are connected, so that the memory cell data is restored and the precharging operation of memory block 1a is performed. In the restoring operation, a word line is driven into the selected state in accordance with the applied row address.

On the other hand, if block designation signal φbra and sense amplifier band designation signal Dr are brought into the active state by the application of the precharge command, a restoring operation of data latched by sense amplifier band 2d with respect to memory cells in memory block 1a is designated. Accordingly, in this case, when the delay time caused by delay circuit 41i is elapsed, set/reset flip-flop 41f is set, so that bit line isolation control signal φBIUa attains to the H level. During the delay time of delay circuit 41i, the restoring operation of the data latched by sense amplifier band 2d to corresponding memory cells in memory block 1a is performed. After the restoring operation, bit line isolation control signal φBIUa attains to the H level, so that bit line isolation circuit 3ua is rendered conductive.

It is noted that, in FIG. 8, signals with respect to isolation control circuit 33da provided for bit line isolation circuit 3da are shown in parentheses. The arrangement of isolation control circuit 33da is the same as that of isolation control circuit 33ua, where positions of sense amplifier band designation signals Ur and Dr are reversed and block designation signal φbrc designating memory block 1c is applied in place to block designation signal φbrb.

Figure 9:
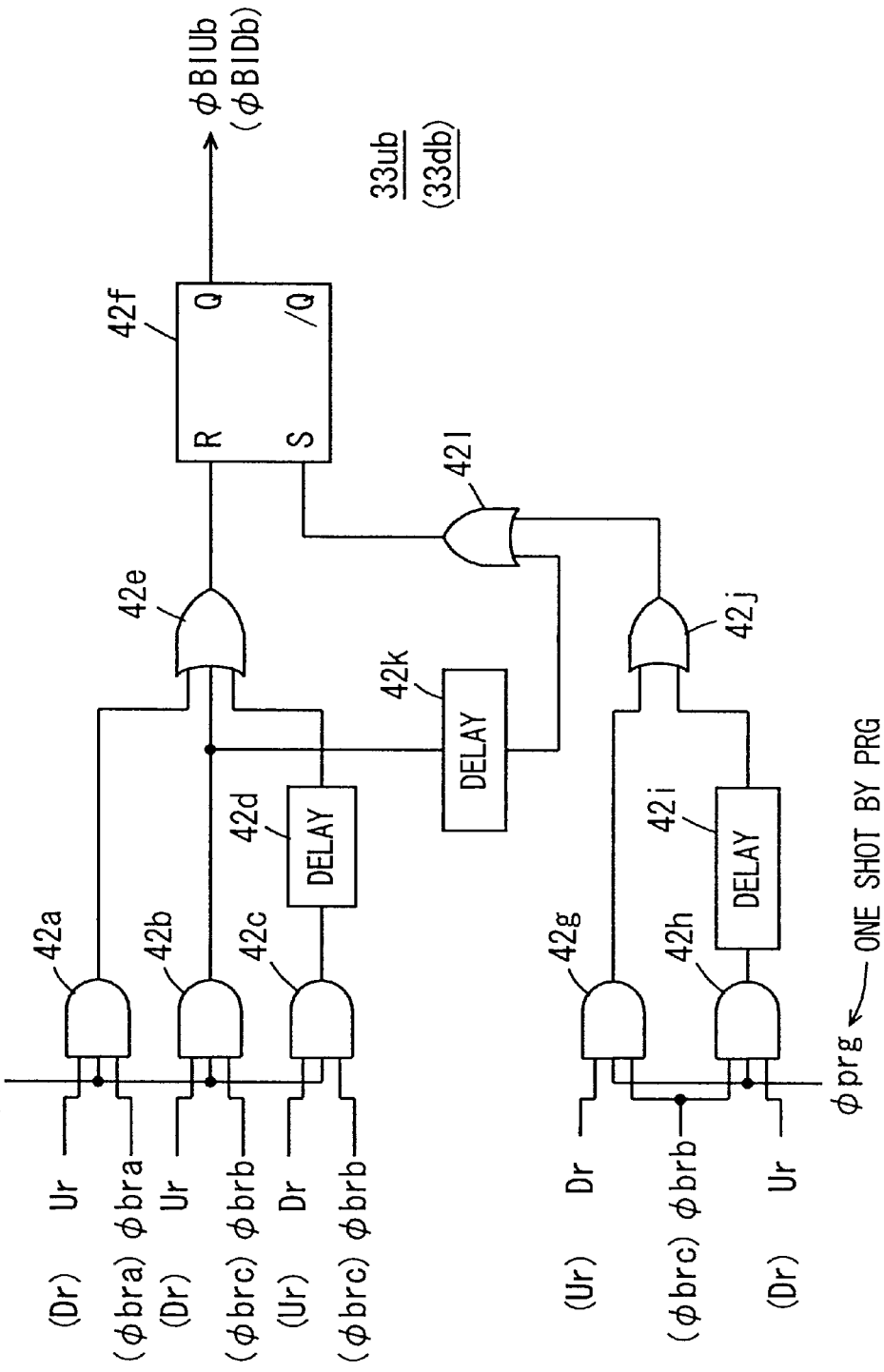
FIG. 9 is a diagram showing an exemplary arrangement of an isolation control circuit shown in FIG. 7.

FIG. 9 is a diagram showing an exemplary arrangement of isolation control circuit 83ub arranged with respect to bit line isolation circuit 3ua shown in FIG. 7. The arrangement of separation control circuit 33ub shown in FIG. 9 is the same as those of isolation control circuits 33ua and 33da shown in FIG. 8 except for the signals applied. More specifically, isolation control circuit 33ub includes: an AND circuit 42a receiving row selection operation activation instruction signal fact, sense amplifier band designation signal Ur and block designation signal φbrb; an AND circuit 42b receiving sense amplifier band designation signal Ur, row selection operation activation instruction signal φact, and block designation signal φbra; an AND circuit 42c receiving row selection operation start instruction signal fact, sense amplifier band designation signal Ur and block designation signal φbrb; a delay circuit 42d delaying an output signal from AND circuit 42c by a prescribed period of time; an OR circuit 42e receiving output signals from AND circuits 42a, 42b and delay circuit 42d; and a set/reset flip-flop 42f reset in response to the rise of the output signal from OR circuit 42e. Bit line isolation control signal φBIUb is outputted from an output Q from set/reset flip-flop 42f.

Isolation control circuit 33ub further includes: an AND circuit 42g receiving precharge instruction signal φprg, sense amplifier band designation signal Ur an block designation signal φbrb; an AND circuit 42h receiving block designation signal φbrb, sense amplifier band designation signal Ur and precharge instruction signal φprg; a delay circuit 42i delaying an output signal from AND circuit 42h; an OR circuit 42j receiving output signals from delay circuit 42i and AND circuit 42a; a delay circuit 42k delaying an output signal from AND circuit 42b; and an OR circuit 42l receiving output signals from delay circuit 42k and OR circuit 42j. Set/reset flip-flop 42f is set in response to the rise of the output signal from OR circuit 42l for driving bit line isolation control signal φBIUb to the H level.

In the arrangement of isolation control circuit 33ub shown in FIG. 9, when memory block 1a and sense amplifier band 2u are designated upon application of the active command, block designation signal φbra and sense amplifier band designation signal Ur are driven into the active state and an output signal from AND circuit 42a attains to the H level. When the output signal from AND circuit 42a attains to the H level, set/reset flip-flop 42f is reset, bit line isolation control signal φBIUb attains to the L level, and bit line isolation circuit 3ub is brought into the non-conductive state. Thus, sense amplifier band 2u is isolated from memory block 1b and receives the memory cell data from memory block 1a.

On the other hand, when memory block 1b and sense amplifier band 2u are designated upon application of the active command, block designation signal φbrb and sense amplifier band designation signal Dr are brought into the active state and, accordingly, the output signal from AND circuit 42c attains to the H level. When the output signal from delay circuit 42d attains to the H level, set/reset flip-flop 42f is reset and bit line isolation control signal φBIUb attains to the L level. Thus, after the data of the selected memory cells of memory block 1b are transmitted to sense amplifier band 2u to be sensed, bit line isolation control signal φBIUb attains to the L level and sense amplifier band 2u and memory block 1b are isolated.

When memory block 1b and the sense amplifier band provided on the upper side of memory block 1b are designated upon application of the active command, memory block designation signal φbrb and sense amplifier band designation signal Ur are activated. When the output signal from AND circuit 42b attains to the H level, set/reset flip-flop 42f is reset and, after a delay time of delay circuit 40k is elapsed, set/reset flip-flop 42f is reset. Thus, in the sensing operation by the sense amplifier band on the upper side of memory block 1b, memory block 1b is isolated from the sense amplifier band on the upper side, and memory block 1b is again connected to sense amplifier band 2u for waiting for a next row selecting operation in memory block 1b.

When memory block 1b and sense amplifier band 2u are designated in the precharging operation, block designation signal φbrb and sense amplifier band designation signal Dr both attain to the H level, set/reset flip-flop 42f is reset in response to the rise of the output signal from AND circuit 42g, bit line isolation control signal φBIUb attains to the H level, and sense amplifier band 2u is connected to memory block 1b, so that the restoring and precharging operations are performed. On the other hand, when memory block 1b and the sense amplifier band on the upper side are designated, block designation signal φbrb and sense amplifier band designation signal Ur are activated. When a delay time of delay circuit 42a is elapsed, set/reset flip-flop 42f is reset. Accordingly, when the restoring operation by the retained data of the sense amplifier band provided on the upper side of memory block 1b is completed, sense amplifier band 2u is connected to memory block 1b.

When the precharging operation with respect to memory block 1a is designated, memory block designation signal φbrb is at the L level and the state of bit line isolation control signal 4BIUb remains unchanged.

It is noted that signals with respect to isolation control circuit 33db provided for bit line isolation circuit 3db are shown in parentheses also in FIG. 9. Block designation signal φbrc is used in place of memory block designation signal φbrb and the positions of sense amplifier band designation signals Ur and Dr are changed.

Figure 10:
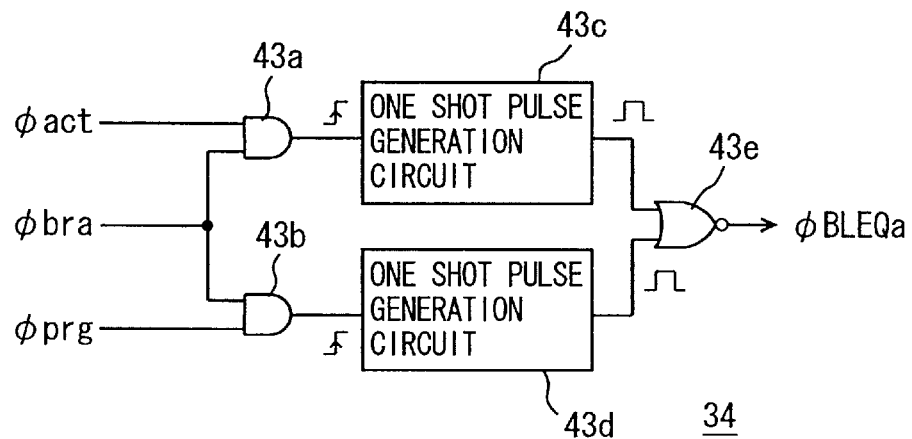
FIG. 10 is a diagram showing an exemplary arrangement of an equalize control circuit shown in FIG. 7.

FIG. 10 is a diagram showing an exemplary arrangement of equalize control circuit 34 shown in FIG. 7. Referring to FIG. 10, equalize control circuit 34 includes: an AND circuit 43a receiving row selection operation activation instruction signal fact and block designation signal φbra; an AND circuit 43b receiving precharging operation instruction signal φprg and block designation signal φbra; a one-shot pulse generation circuit 43c generating a one-shot pulse signal in response to the rise of the output signal from AND circuit 43a; a one-shot pulse generation circuit 43d generating a one-shot pulse signal in response to the rise of the output signal from AND circuit 43b; and an NOR circuit 43e receiving output signals from one-shot pulse generation circuits 43c and 43d for outputting bit line equalize instruction signal φBLEQa.

One-shot pulse generation circuit 43c generates a one-shot pulse signal having a pulse width approximately corresponding to an activation period of the word line in the row selection operation. One-shot pulse generation circuit 43b generates a pulse signal having a pulse width approximately corresponding to the activation period of the word line in the precharging operation.

These one-shot pulse generation circuits 43c and 43b generate pulse signals which are maintained at the H level for a prescribed period of time. Bit line equalize instruction signal φBLEQa from NOR circuit 43e is accordingly brought into the inactive state when a word line is in the selected state in memory block 1a.

Figure 11:
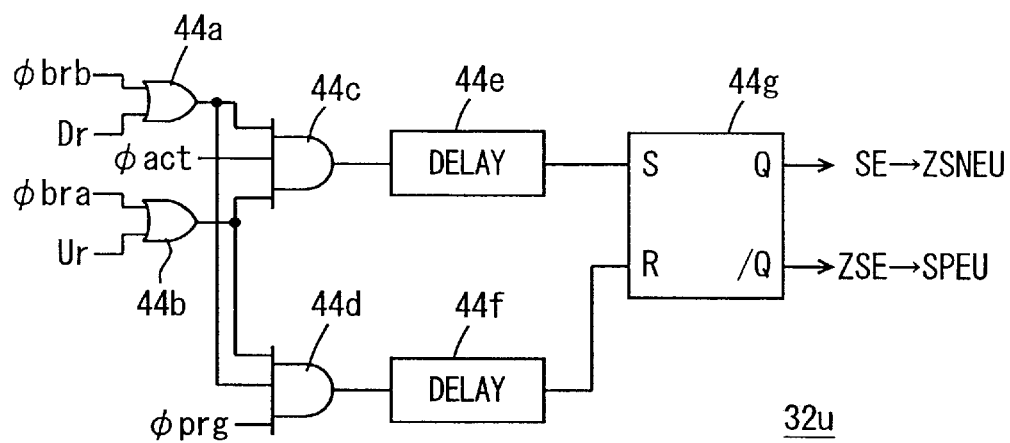
FIG. 11 is a diagram showing an exemplary arrangement of a sense amplifier control circuit shown in FIG. 7.

FIG. 11 is a diagram showing an exemplary arrangement of sense amplifier control circuit 32u shown in FIG. 7. Referring to FIG. 11, sense amplifier control circuit 32u includes: an OR circuit 44a receiving precharging operation instruction signal φprg and sense amplifier band designation signal Dr; an OR circuit 44b receiving block designation signal φbra and sense amplifier band designation signal Ur; an AND circuit 44c receiving output signals from OR circuits 44a and 44b as well as row selection operation activation instruction signal fact; a delay circuit 44e delaying an output signal from AND circuit 44c by a prescribed period of time; an AND circuit 44d receiving output signals from OR circuits 44a and 44b as well as precharging operation instruction signal φprg; a delay circuit 44f delaying an output signal from AND circuit 44d by a prescribed period of time; and a set/reset flip-flop 44g set in response to the rise of an output signal from delay circuit 44f and reset in response to the rise of an output signal from delay circuit 44f. A sense activation signal SE is outputted from an output Q of set/reset flip-flop 44g, and a complementary sense activation signal ZSE is outputted from an output/Q. Sense amplifier activation signals ZSNEU and SPEU are generated by sense amplifier activation transistors in accordance with sense activation signals SE and ZSE.

In the arrangement of sense amplifier control circuit 32u shown in FIG. 11, when sense amplifier band 2u is designated, set/reset flip-flop 44g is set or reset in accordance with row selection operation activation instruction signal fact or precharging operation instruction signal φprg for activating/inactivating sense activation signals SE and ZSE. The delay time of delay circuit 44e approximately corresponds to that of delay circuit 41d shown in FIG. 8, and the delay time of delay circuit 44f approximately corresponds to those of delay circuits 42i and 41i shown in FIGS. 8 and 9, so that the sense amplifier can be inactivated after the sense amplifier is activated and the word line is brought into the non-selected state, for the restoring operation with the memory block and the sense amplifier band being isolated.

It is noted that the arrangement of sense amplifier control circuit 42d can be achieved if block designation signals φbra and φbrc are used instead of block designation signals φbra and φbrb.

Figure 12:
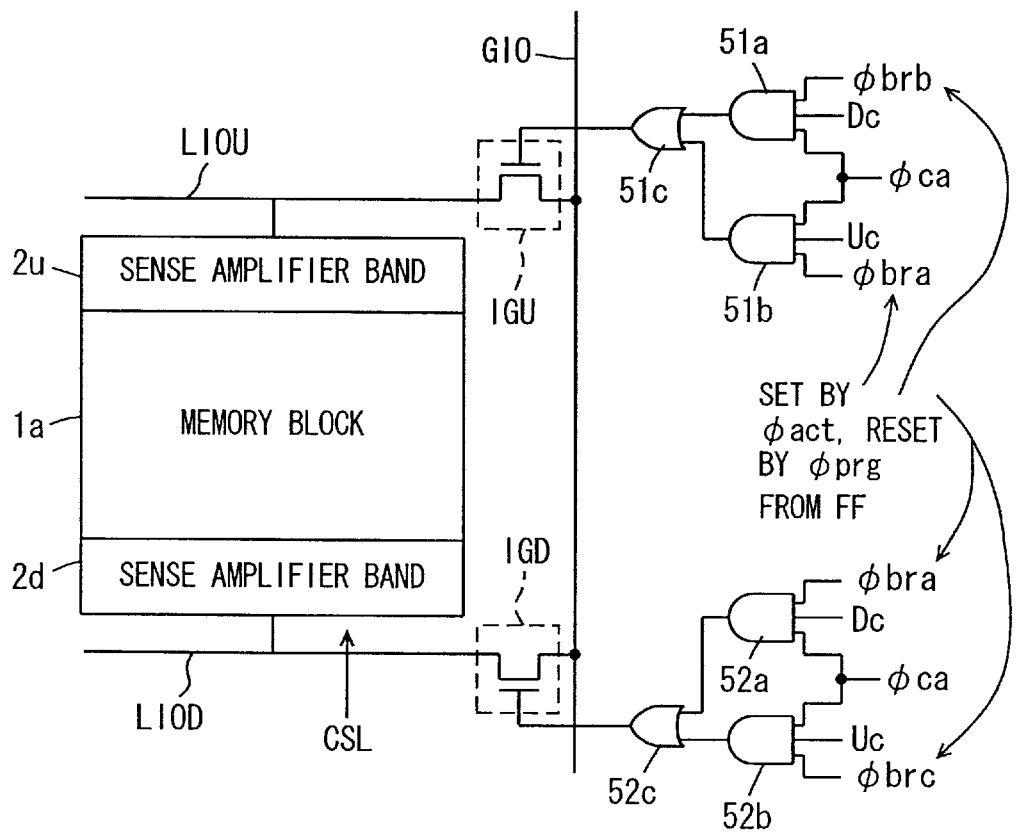
FIG. 12 is a diagram showing exemplary arrangements of a column related control circuit and a column related circuit shown in FIG. 7.

FIG. 12 is a diagram showing an exemplary arrangement of a column related control circuit. Referring to FIG. 12, local data buses LIOU and LIOD are arranged corresponding to sense amplifier bands 2u and 2d, respectively. The sense amplifier circuit included in sense amplifier band 2u is connected to local data bus LIOU in accordance with column selection signal CSL from a column decoder (not shown). In addition, the sense amplifier circuit included in sense amplifier band 2d is connected to local data bus LIOD in accordance with column selection signal CSL.

A global data bus GIO is shared by a plurality of memory blocks. Local data buses LIOU and LIOD are connected to global data bus GIO through block selection gates IGU and IGD, respectively. Global data bus GIO is connected to a writing/reading circuit (not shown).

A circuit for controlling the conductive/non-conductive state of block selection gate IGU includes: an AND circuit 51a receiving block designation signal φbrb, a sense amplifier band designation signal Dc, and a column access instruction signal φca; an AND circuit 51b receiving column access instruction signal φca, sense amplifier band designation signal Uc, and block designation signal φbra; and an OR circuit 51c receiving output signals from AND circuits 51a and 51b.

Column access instruction signal φca is activated for a prescribed period of time upon application of a read command or a write command. Sense amplifier band designation signal Dc or Uc is simultaneously applied upon application of a column access command (a read or write command) upon column access (upon application of the read or write command). Block designation signals φbrb and φbra are generated from a flip-flop which is set upon application of the active command and reset upon application of a precharge command. More specifically, when a logical product of the block designation signal and the active command (row selection operation activation instruction signal) is in the active state, the flip-flop is set. When the precharge command (precharging operation instruction signal) and the block designation signal are both applied, the corresponding flip-flop is reset. In this case, a block address (RAb) may be applied with the column address upon application of the column access command.

Accordingly, when memory cells are selected in memory block 1a or 1b and the memory cell data are latched by sense amplifier band 2u, memory block designation signal φbrb or φbra is in the active state. If data access to sense amplifier band 2u is instructed in this state, an output signal from OR circuit 51c attains to the H level, block selection gate IGU is rendered conductive, local data bus LIOU is connected to global data bus GIO, and the sense amplifier circuit included in sense amplifier band 2u is accessed.

A circuit for controlling the conductive/non-conductive state of block selection gate IGD includes: an AND circuit 52a receiving block designation signal φbra, sense amplifier band designation signal Dc and column access instruction signal φca; an AND circuit 52b receiving column access instruction signal φca, block designation signal φbrc and sense amplifier band designation signal Uc; and an OR circuit 52c receiving output signals from AND circuits 52a and 52b. Similarly, in the circuit arrangement, if access to sense amplifier band 2d is instructed when memory cell data are latched by sense amplifier band 2b, an output signal from OR circuit 52c attains to the H level, so that block selection gate IGD is rendered conductive.

Thus, the sense amplifier band whose data is to be accessed is surely connected to global data bus GIO without causing any data confliction for data access.

Figure 13:
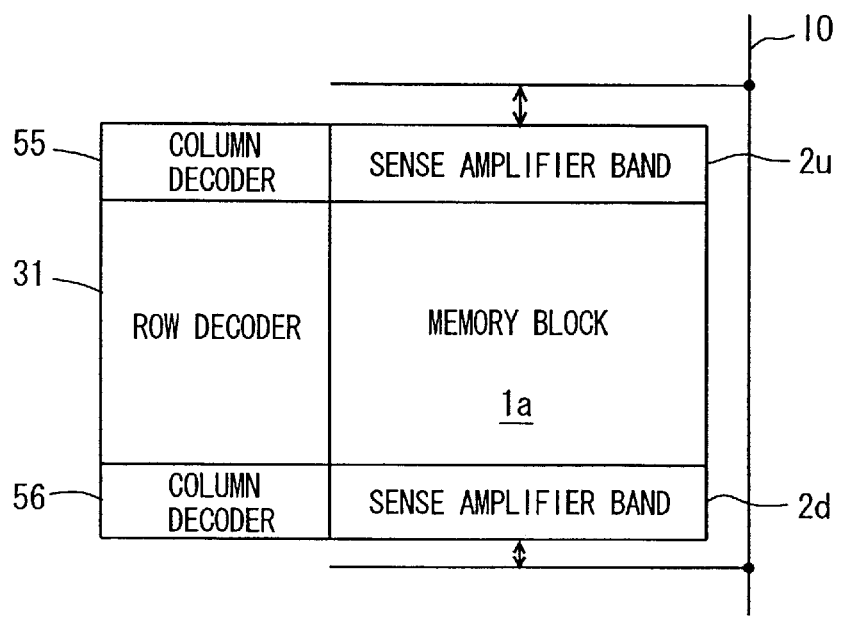
FIG. 13 is a diagram schematically showing another arrangement of the column related circuit shown in FIG. 7.

FIG. 13 is a diagram showing a modification of the column related circuit. In FIG. 13, column decoders 55 and 56 are arranged corresponding to sense amplifier bands 2u and 2d, respectively. When corresponding column decoders 55 and 56 are activated for generating column selection signals, sense amplifier bands 2u and 2d are selectively connected to internal data bus 10.

Column decoders 55 and 56 are for example 1/16 decoders. 1/16 sense amplifier circuits are selected from memory cells in one row (sense amplifier circuits in one row), to reduce the number of column address bits to be applied to the column decoder. Concurrently, block address RAb designating a memory block is also applied. Accordingly, only column decoder 55 or 56 arranged for the sense amplifier whose data is to be accessed is activated, so that the selected sense amplifier circuits are connected to internal data bus IO.

In the arrangement shown in FIG. 13, the data bus width of internal data bus IO is appropriately determined. The internal data bus may be arranged over memory block 1a. In addition, even if internal data bus 10 has a large bit width of for example 128 bits, with the appropriate number of bits of lower column address bits, the writing/reading circuits are selectively activated, so that the number of input/output data bits can be reduced.

In addition, an arrangement similar to that for controlling the conductive/non-conductive state of block selection gates IGU and IGD shown in FIG. 12 may be used for controlling the active/inactive state of column decoders 55 and 56.

Figure 14:
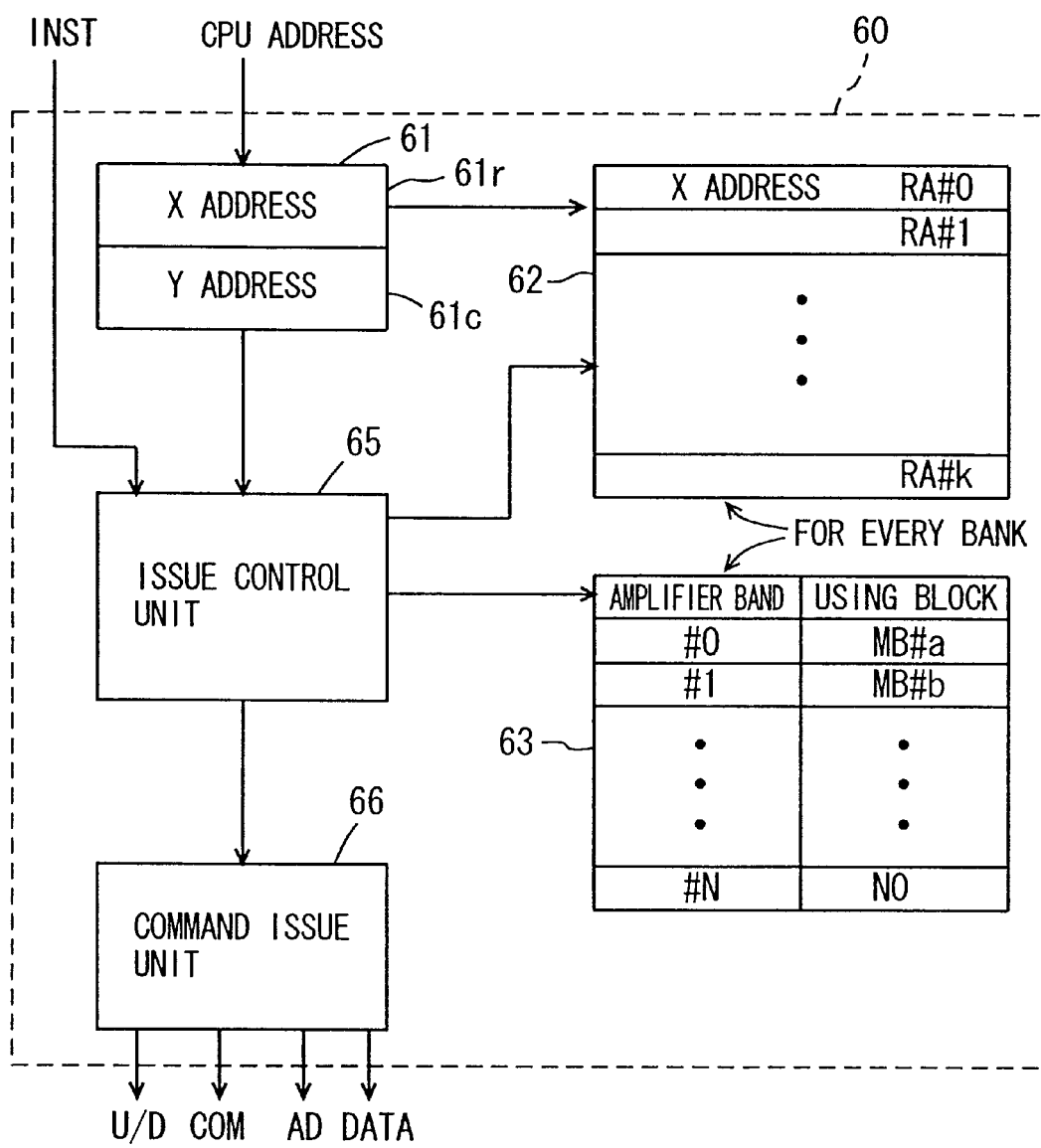
FIG. 14 is a diagram schematically showing an arrangement of a memory co roller used in the first embodiment of the present invention.

FIG. 14 is a diagram schematically showing an exemplary arrangement of a memory controller for controlling access with respect to a memory device. Referring to FIG. 14, memory controller 60 includes: an address register circuit 61 classifying CPU addresses applied from a processor (CPU) into X and Y addresses for storage; a register file 62 sequentially storing the X addresses from address register circuit 61 during the active state of the X address; a register file 63 storing information on memory block using the sense amplifier band for each of the sense amplifier bands; an issue control unit 65 writing the X address to register file 62 in accordance with an address from address register circuit 61 and an instruction INST from the processor and determining if there is any available sense amplifier band with reference to register file 63 in accordance with the applied X address for determining the destination of the command based on the determination result; and a command issue unit 66 issuing a sense amplifier band designation bit U/D, a command COM, an address AD, and data (in a writing mode) DATA under control of issue control unit 65.

Address register circuit 61 includes a register 61r storing the X address and a register 61c storing a Y address. The X address stored in register 61r includes an address bit RAb designating a memory block and a row address RAa designating a row in the memory block.

Information on X address in the active state (a corresponding row is in the selected state) is stored in register file 62. FIG. 14 represents the case where addresses RA#0–RA#k are in the active state by way of example. Issue control unit 65 prepares and issues a precharge command through command issue unit 66 when a data process with respect to the designated X address is completed. The X address to which the precharge command is issued is reset in register file 62. Register file 62 may have a FIFO (First-In, First-Out) structure.

Register file 63 has fields corresponding to the sense amplifier bands and stores information designating the memory block that uses the corresponding sense amplifier band in each field. FIG. 14 represents the case where the information designating the memory block that uses the sense amplifier bands is stored for sense amplifier bands #0–#N by way of example. Sense amplifier bands #0 and #1 are used by memory blocks MB#a and MB#b, sense amplifier band #N is in the inactive state (the precharge state) and is not used by any memory block.

Issue control unit 65 first determines if the sense amplifier band available to the X address is used with reference to register file 63 when the X address is applied from register circuit 61. If there is any available sense amplifier band, the information of the available sense amplifier band is written to the using block field, and sense amplifier band designation bit U/D is generated in accordance with the available sense amplifier band. Here, a relationship between the memory blocks and the sense amplifier bands (designation bits U/D) is stored in a table (not shown) in advance. When the memory block and the sense amplifier band to be used are determined, sense amplifier band designation signal bit U/D is uniquely generated. If there is no available sense amplifier band, issue control unit 65 causes the processor to wait until the process with respect to the row that uses the sense amplifier band is completed. When the access to the row is completed (when the precharge command is issued), issue control unit 65 a rewrites information designating the newly using memory block over the using block of the corresponding sense amplifier band, and issues an active command after the precharge command is issued.

Command issue unit 66 generates various kinds of signals and data in synchronization with a clock signal under control of issue control unit 65.

By referring to register files 62 and 63, the sense amplifier band can readily be designated when the row related commands (active command and precharge command) are issued, and the row whose data is to be restored can readily be designated when the precharge command is issued.

Figure 15:
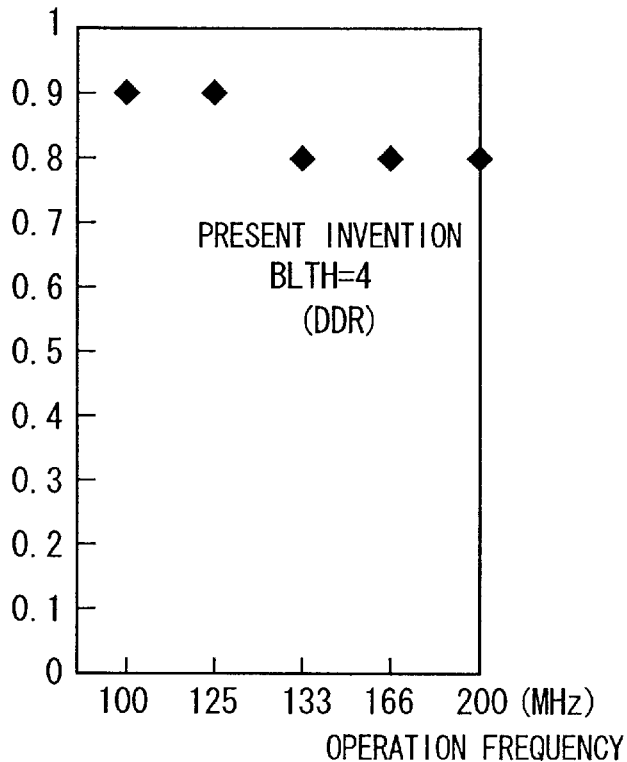
FIG. 15 is a graph showing a relationship between a bus utilization efficiency and an operation frequency of the semiconductor memory device according to the present invention.

FIG. 15 is a graph showing a bus utilization efficiency of the semiconductor memory device according to the first embodiment of the present invention. FIG. 15 shows the bus utilization efficiency in random access when burst length BLTH is 4 and data transfer is performed in the DDR mode. If an operation frequency is 100 MHz or 125 MHz, a penalty in page switching is hardly caused and the bus utilization efficiency is about 0.9. On the other hand, if the operation frequency increases to 133, 166 and 200 MHz, the bus utilization efficiency reaches about 0.8 because of column latency CL and row access time. Accordingly, as compared with the bus utilization efficiency of the DRAM in the conventional DDR mode, the bus utilization efficiency can significantly be increased (this is because page switching is not required).

As described above, according to the first embodiment of the present invention, sense amplifier circuits are arranged at both ends of a bit line pair and data access is performed with the memory cell data being retained in the sense amplifier circuits and with the memory block and the sense amplifier circuit being isolated. Thus, after data is latched by the sense amplifier circuit, the memory block can be brought back into the precharge state for a next row address. Accordingly, the bus utilization efficiency during random access for row selection is increased, so that a high speed data processing system is established.

Second Embodiment

Figure 16A:
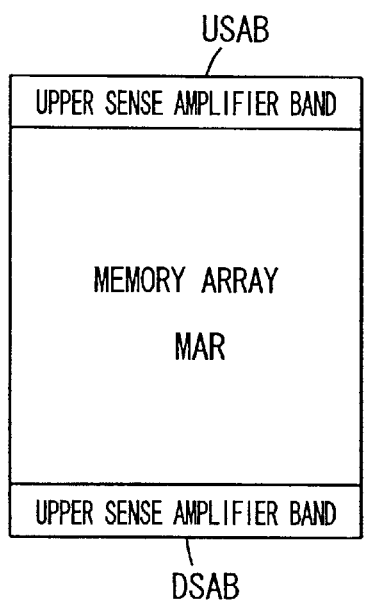
FIG. 16 is a diagram schematically showing an array arrangement according to a second embodiment of the present invention.
FIG. 16B is a diagram schematically showing a specific arrangement of the memory array shown in FIG. 16A.

FIG. 16A is a diagram schematically showing an arrangement of an array of a semiconductor memory device according to the second embodiment of the present invention. Referring to FIG. 16A, an upper sense amplifier band USAB is arranged on the upper side of memory array MAR, and a lower sense amplifier band DSAB is arranged on the lower side of memory array MAR. The array arrangement is managed with reference to a logic address by a memory controller.

Figure 16B:
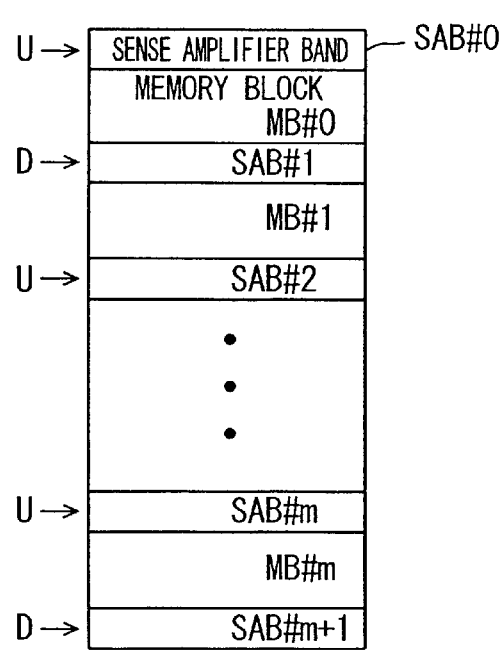

FIG. 16B is a diagram showing an arrangement of a memory array portion of the semiconductor memory device. The memory array is divided into memory blocks MB#0–MB#m. Sense amplifier bands SAB#1–SAB#m are arranged between the memory blocks, and sense amplifier bands SAB#0 and SAB#m+1 are arranged outside memory blocks MB#0 and MB#m, respectively. In the arrangement of memory array MAR according to the logic address in the memory controller, one page includes a plurality of word lines of the actual semiconductor memory device (DRAM). The memory block and the word line are selected in the DRAM in accordance with the logic address.

Sense amplifier bands SAB#0–SAB#m+1 are uniquely classified as sense amplifier bands included in upper and lower sense amplifier bands USAB and DSAB. More specifically, in FIG. 16B, even-numbered sense amplifier bands SAB#0, SAB#2 . . . SAB#m are classified as sense amplifier band (U) belonging to upper sense amplifier band USAB, whereas odd-numbered sense amplifier bands SAB#1, SAB#3, . . . SAB#m+1 are classified as sense amplifier band (D) belonging to lower sense amplifier band DSAB.

In the memory controller, when two rows are successively accessed in memory array MAR, upper and lower sense amplifier bands USAB and DSAB are alternately allocated. Accordingly, in the memory controller, the sense amplifier band to be used needs only be monitored to determine if it belongs to the upper or lower sense amplifier band for each bank, so that control of the memory controller is facilitated (the memory block to be used needs not be monitored for each sense amplifier band). On the other hand, in the DRAM, since upper and lower sense amplifier band designation signals U and D are merely fixed, control signals U and D of the isolation control circuit applied to the bit line isolation circuit are appropriately changed in accordance with the position of the memory block. In other words, in the arrangement of the isolation control circuit shown in FIGS. 8 and 9, for sense amplifier band designation signals Ur and Dr, only upper sense amplifier band designation signal Ur or lower sense amplifier band designation signal Dr is used in accordance with the fact that the corresponding sense amplifier band belongs to upper or lower sense amplifier band USAB or DSAB.

As described above, according to the second embodiment of the present invention, since a sense amplifier band is uniquely set as the upper or lower sense amplifier band, the load on management of the sense amplifier band by the memory controller is mitigated. It is noted that, in the case of the arrangement shown in FIG. 16A, if page switching further occurs when two rows are in the selected state in a bank there is need to wait.

Third Embodiment

Figure 17:
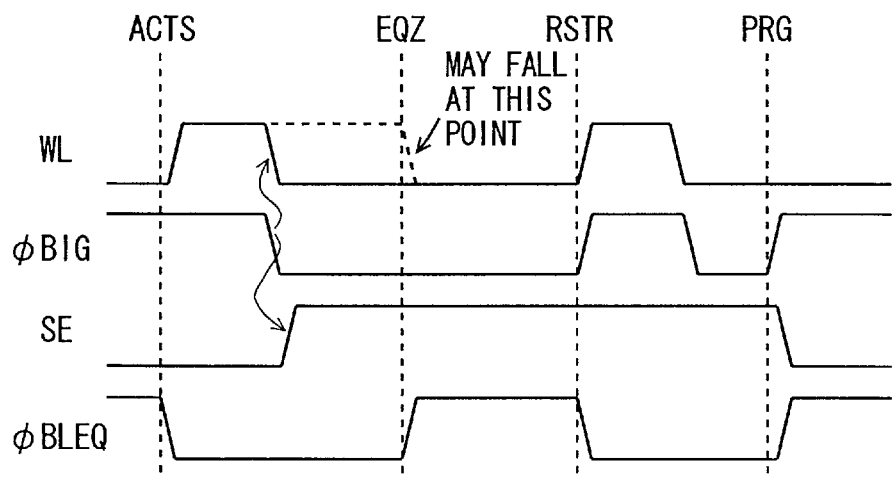
FIG. 17 is a diagram showing signal waveforms related to an internal operation when an external command is applied in a third embodiment of the present invention.

FIG. 17 is a diagram schematically showing signal waveforms related to externally applied command and corresponding operation mode in the third embodiment of the present invention. In the third embodiment, a sense active command ACTS, a bit line equalize command EQZ, and a restore command RSTR are newly provided. Precharge command PRG is the same as that in the above described first embodiment and designates a sense amplifier band to be precharged.

When sense active command ACTS is applied, bit line equalize instruction signal φBLEQ is brought into the inactive state in accordance with a block designation signal, and an equalizing operation with respect to the bit line pairs in the designated memory block is completed. Thereafter, a word line WL is driven into the selected state in the selected memory cell block and, successively, a bit line isolation circuit between the selected memory block and the selected sense amplifier band is isolated in accordance with isolation control signal φBIG. Word line WL is driven into the inactive state approximately at the same time as the isolation and, sense amplifier activation signal SE with respect to the designated sense amplifier band is activated. This state is maintained until a new command is applied next.

Equalize command EQZ instructs to equalize bit line pairs BLP. When bit line equalize command EQZ is applied, bit line equalize instruction signal φBLEQ is brought back to the state instructing precharge in every memory block.

When restore command RSTR is applied, word line WL to be restored is driven into the selected state for a prescribed period of time in accordance with an address supplied from the memory controller, corresponding bit line isolation control signal φBIG is maintained at the H level for a prescribed period of time, and the designated memory block and sense amplifier band are connected. Bit line equalize instruction signal φBLEQ is brought into the inactive state in the selected memory block upon application of restore command RSTR. Thus, memory cell data that has been retained in each sense amplifier circuit of the sense amplifier band is written back to the original memory cell.

When access to the sense amplifier band is completed, precharge command PRG is applied, sense amplifier activation signal SE is brought into the inactive state, bit line equalize instruction signal φBLEQ is brought into the active state, bit line isolation control signal φBIG attains to the H level, and the sense amplifier band and the memory block are connected.

It is noted that the selected word line may be maintained in the selected state until an equalize command is applied (indicated by a dotted-line waveform).

Figure 18:
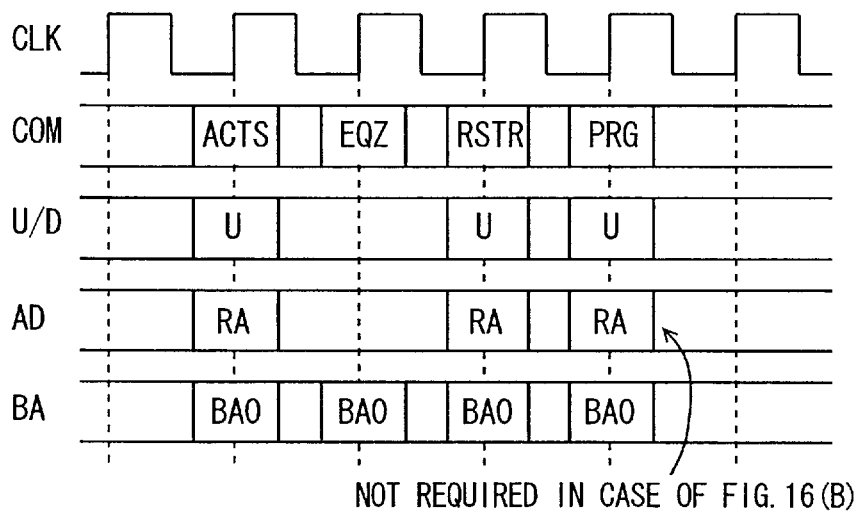
FIG. 18 is a diagram showing an application manner of the external commands shown in FIG. 17.

FIG. 18 is a diagram schematically showing a configuration of the new command shown in FIG. 17. Referring to FIG. 18, sense active command ACTS is applied with sense amplifier band designation bit U/D, row address signal RA, and bank address signal BA. In FIG. 18, sense amplifier band designation bit U is designated by way of example. The corresponding sense amplifier band designated in the selected memory block is activated. Bit line equalize command EQZ is applied with bank address signal BA. In FIG. 18, bank address BA0 designating bank #0 is designated by way of example. In this case, the equalize operation is performed on the bit line pair in every memory block in bank BA0.

In the restoring operation, a restore command RSTR as command COM is applied with sense amplifier band designation bit U/D (bit U is shown in FIG. 18), row address signal RA, and bank address signal BA.

When precharge command PRG is applied, sense amplifier band designation bit U/D (U is shown in FIG. 18), row address signal RA, and bank address signal BA are simultaneously applied. Row address signal RA is applied upon application of precharge command PRG because the block designation signal for designating the sense amplifier band to be precharged must be generated. However, as shown in FIG. 16B, when each sense amplifier band is uniquely determined as the upper or lower sense amplifier band, the sense amplifier band can be designated by sense amplifier band designation bit U/D and row address signal RA needs not be applied upon application of the precharge command PRG.

As shown in FIG. 18, if a command for partially performing a row-related operation is newly prepared, each memory block and sense amplifier band can correctly be set in a desired state at an appropriate timing at the time of data transfer without causing any data confliction in the memory block under control of the memory controller.

In addition, such new commands ACTS, EQZ and RSTR contribute to simplification of the structure of the controlling portion.

Figure 19:
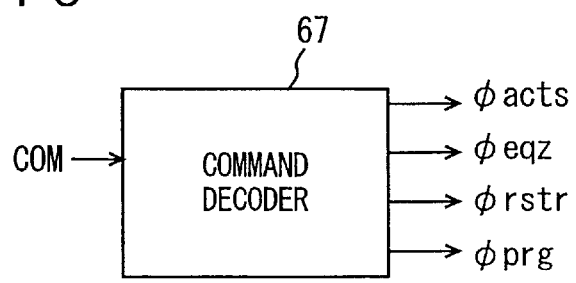
FIG. 19 is a diagram schematically showing an arrangement of a command decoder according to the third embodiment of the present invention.

FIG. 19 is a diagram related to an operation mode designation signal generated by a command decoder. Referring to FIG. 19, command decoder 67 incorporates and decodes applied command COM in synchronization with the rise of clock signal CLK for generating an operation mode designation signal used for activation of an operation mode designated by command COM. A sense operation instruction signal facts is activated upon application of sense active command ACTS. Bit line equalize instruction signal φeqz is activated upon application of bit line equalize command EQZ. Restore operation instruction signal φrstr is activated upon application of restore command RSTR. Precharging operation instruction signal φprg is activated upon application of precharge command PRG. The operation mode instruction signal from command decoder 67 is a one-shot pulse signal.

Figure 20:
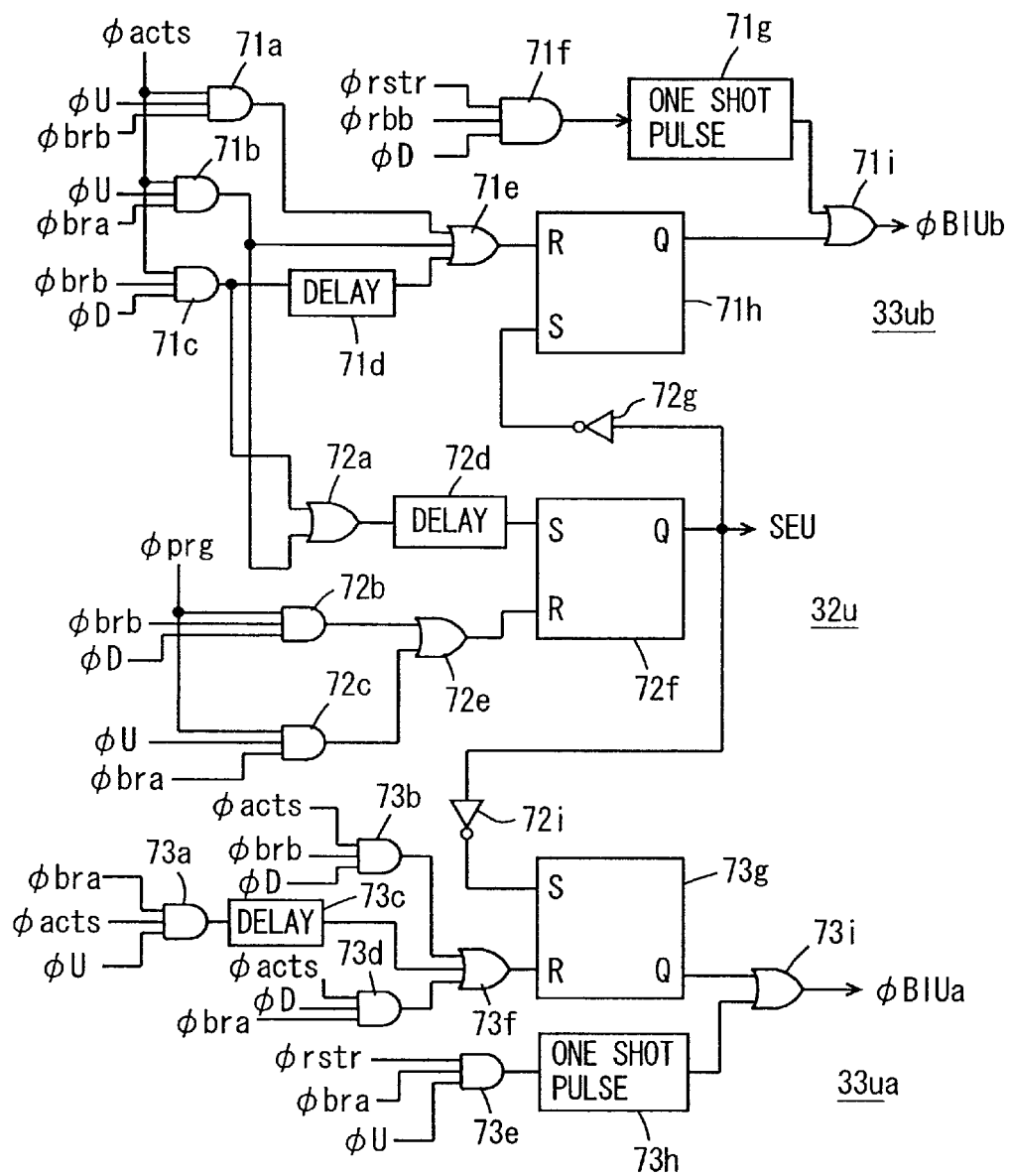
FIG. 20 is a diagram showing exemplary arrangements of an isolation control circuit and a sense amplifier control circuit according to the third embodiment of the present invention.

FIG. 20 is a diagram showing exemplary arrangements of a bit line isolation control circuit and a sense amplifier control circuit in the third embodiment of the present invention. FIG. 20 shows isolation control circuits 33ua and 33ub arranged corresponding to a sense amplifier control circuit 32u and bit line isolation circuits 3ua, 3ub for sense amplifier band 2u, respectively.

Referring to FIG. 20, isolation control circuit 33ub includes: an AND circuit 71a receiving sense operation instruction signal φacts, an upper sense amplifier band designation signal φU, and a block designation signal φbrd designating block 1b; an AND circuit 71b receiving sense operation instruction signal φacts, block designation signal φrba, and sense amplifier band designation signal φU; an AND circuit 71c receiving sense operation instruction signal φacts, block designation signal φbrb, and sense amplifier band designation signal φd designating the lower sense amplifier band; a delay circuit 71d delaying an output signal from AND circuit 71c by a prescribed period of time; an OR circuit 71e receiving output signals from AND circuits 71a and 71b as well as an output signal from delay circuit 71-d; an AND circuit 71f receiving restoring operation instruction signal φrstr, block designation signal φbrb, and sense amplifier band designation signal φD; a one-shot pulse generation circuit 71g generating a one-shot pulse signal in response to the rise of an output signal from AND circuit 71f; a set/reset flip-flop 71h reset in response to the rise of an output signal from OR circuit 71e; and an OR circuit 71i receiving a signal from an output Q of set/reset flip-flop 71h and an output signal from one-shot pulse generation circuit 71d for outputting bit line isolation control signal φBIUb.

Sense control circuit 32u includes: an OR circuit 72a receiving output signals from AND circuits 71b and 71c; an AND circuit 72b receiving precharging operation instruction signal φprg, block designation signal φbrb, and sense amplifier band designation signal φD; an AND circuit 72c receiving precharging operation instruction signal φprg, sense amplifier band designation signal φU, and block designation signal φbra; an OR circuit 72e receiving output signals from AND circuits 72b and 72c; a delay circuit 72d delaying an output signal from OR circuit 72a by a prescribed period of time; and a set/reset flip-flop 72d set in response to the rise of an output signal from delay circuit 72f and reset in response to the rise of an output signal from OR circuit 72e for outputting sense activation signal SEU from output Q.

Isolation control circuit 33ua includes: an AND circuit 73a receiving block designation signal φbra, sense operation instruction signal φacts, and sense amplifier band designation signal φU; a delay circuit 73c delaying an output signal from AND circuit 73a by a prescribed period of time; an AND circuit 73b receiving sense operation instruction signal φacts, block designation signal φbrb, and sense amplifier band designation signal φD; an AND circuit 73b receiving sense operation instruction signal φacts, sense amplifier band designation signal φD, and block designation signal φbra; an OR circuit 73f receiving output signals from AND circuits 73b and 73d as well as an output signal from delay circuit 73c; an AND circuit 73e receiving restoring operation instruction signal φrstr, block designation signal φbra, and sense amplifier band designation signal φU; a set/reset flip-flop 73g set in response to the rise of sense activation signal SEU applied through inverter 72i and reset in response to the rise of an output signal from OR circuit 73f; a one-shot pulse generation circuit 73h generating a one-shot pulse signal in response to the rise of an output signal from AND circuit 73e; and an OR circuit 73i receiving a signal from output Q of set/reset flip-flop 73g and an output signal from one-shot pulse generation circuit 73h for outputting bit line isolation control signal φBIUa.

When memory block 1a and sense amplifier band 2u are designated 5 and sense active command ACTS is applied, an output signal from AND circuit 71b attains to the H level, set/reset flip-flop 71h is reset by OR circuit 71e, bit line isolation control signal φBIUb attains to the L level, and memory block 1b and sense amplifier band 2u are isolated. On the other hand, when an output signal from OR circuit 72a attains to the H level and a delay time of delay circuit 72d is elapsed, set/reset flip-flop 72f is set, sense amplifier activation signal SE is activated and a sensing operation is performed. Data of a selected memory cell is transferred from a corresponding bit line to the sense amplifier circuit during the delay time of delay circuit 72d.

In isolation control circuit 33ua, when an output signal from AND circuit 73a attains to the H level and a delay time of delay circuit 73c is elapsed, an output signal from OR circuit 73f attains to the H level, set/reset flip-flop 73e is reset, bit line isolation control signal φBIUa attains to the L level, and memory block 1a and sense amplifier band 2u are isolated. By appropriately adjusting delay times of delay circuits 73c and 72d, sense amplifier activation signal SEU can be activated when memory block 1a and sense amplifier band 2u are isolated.

When the restoring operation with respect to sense amplifier band 2u is instructed, in isolation control circuit 33ua, an output signal from AND circuit 73e attains to the H level, and one-shot pulse generation circuit 73h generates a pulse signal which is maintained at the H level for a prescribed period of time. Accordingly, bit line isolation control signal φBIUa from OR circuit 73i attains to the H level, memory block 1a and sense amplifier band 2u are connected, and the restoring operation is performed.

When a precharging instruction with respect to sense amplifier band 2u is applied, in sense amplifier control circuit 32u, an output signal from AND circuit 72c attains to the H level, an output signal from OR circuit 72e attains to H level, set/reset flip-flop 72f is reset, sense amplifier activation signal SEU is inactivated, and the sensing operation is completed. On the other hand, an output signal from inverter circuit 72i attains to the H level, set/reset flip-flops 71h and 73g are set, and bit line isolation control signals φBIUb and φBIUa both attain to the H level.

Therefore, as shown in FIG. 20, by utilizing sense active command ACTS and restore command RSTR, logics of sense amplifier control circuit 34 as well as bit line isolation control circuits 33db and 33ub are simplified, so that the circuit arrangements are also simplified.

It is noted that, when the non-selected sense amplifier opposed to the selected sense amplifier band must be isolated from the memory block during the restoring operation, the sense separation control signal of the counterpart is set to the L level by output signals from one-shot pulse generation circuits 71g and 73h. For example, isolation control signal φBIUa is set at the L level by an output signal from one-shot pulse generation circuit 71g.

Figure 21:
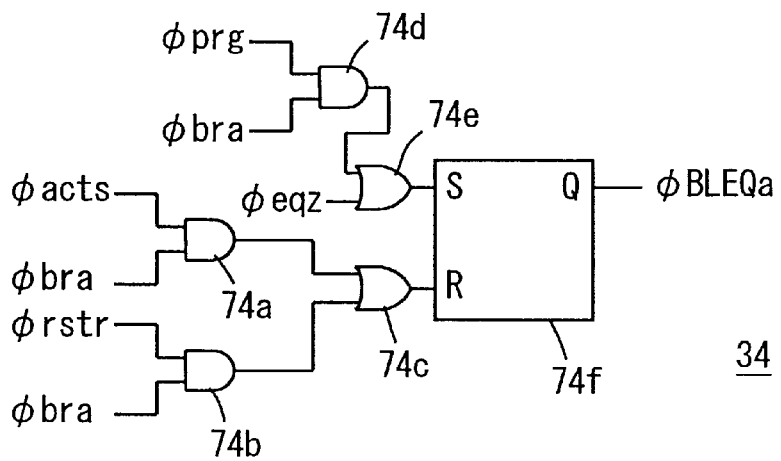
FIG. 21 is a diagram showing an exemplary arrangement of an equalize control circuit according to the third embodiment of the present invention.

FIG. 21 is a diagram showing an exemplary arrangement of equalize control circuit 34 with respect to memory block 1a. Referring to FIG. 21, equalize control circuit 34 includes: an AND circuit 74a receiving sense operation instruction signal φacts and block designation signal φbra; an AND circuit 74b receiving restoring operation instruction signal φrstr and block designation signal φbra; and AND circuit 74d receiving precharging operation instruction signal φprg and block designation signal φbra; an OR circuit 74e receiving bit line equalize instruction signal φeqz which is activated for a prescribed period of time upon application of a bit line equalize command EQZ and an output signal from AND circuit 74d; and a set/reset flip flop 74f set in response to the rise of an output signal from OR circuit 74e and reset in response to the rise of an output signal from OR circuit 74c. Bit line equalize instruction signal φBLEQa is output from set/reset flip flop 74f.

When the sense active command or restore command is applied to memory block 1a, an output signal from AND circuit 74a or 74b attains to the H level and, accordingly, an output signal from OR circuit 74c attains to the H level. As a result, set/reset flip flop 74f is reset, bit line equalize instruction signal φBLEQa attains to the L level, and the precharging operation with respect to memory block 1a is stopped.

When precharge command PRG is applied to memory block 1a or bit line equalize command EQZ is applied, an output signal from OR circuit 74e attains to the H level, bit line equalize instruction signal φBLEQa attains to the H level, and the bit line equalizing operation with respect to memory block 1a is activated.

Therefore, as shown in FIG. 21, by providing a command instructing the restoring operation and the bit line equalize command instructing the bit line equalizing operation, the arrangement of the equalize control circuit can be simplified, so that data of memory cells in a different row are correctly latched by the sense amplifier band provided for memory block 1a for data access.

It is noted that commands ACTS, EQZ and RSTR are sequentially issued in a prescribed sequence by the memory controller at an appropriate timing.

It is noted that the selected word line may be driven into the non-selected state when bit line equalize command EQZ is applied. More specifically, the word line corresponding to an addressed row is maintained in the selected state upon application of sense active command ACTS, and the word line in the selected state is driven into the non-selected state upon application of bit line equalize command EQZ and the bit line equalize circuits are activated. The timing at which the row decoder is inactivated is set with reference to application of the sense active command or the row decoder is reset upon application of the bit line equalize instruction command, so that a structure of driving the word line in the selected state into the non-selected state upon application of bit line equalize command can readily be achieved.

As described above, according to the third embodiment of the present invention, the sense active command for transferring memory cell data to the sense amplifier and performing the sensing operation with the memory block and the sense amplifier band being isolated, the bit line equalize command for precharging the bit line pair, and the restore command for transferring the data latched by the sense amplifier band to the original memory cells are prepared. Therefore, data are correctly transferred between the sense amplifier band and the memory block and memory cell data can be latched at the sense amplifier circuit without causing any data destruction with a simplified circuit arrangement.

Fourth Embodiment

Figure 22:
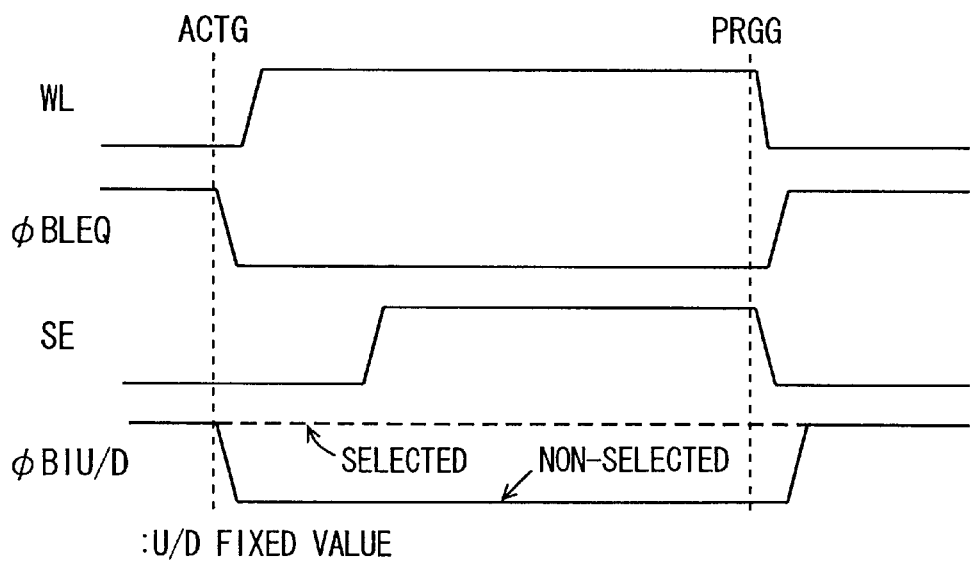
FIG. 22 is a diagram showing signal waveforms related to the external command and the corresponding internal operations according to a fourth embodiment of the present invention.

FIG. 22 is a diagram showing signal waveforms related to an operation of a semiconductor memory device according to the fourth embodiment of the present invention. Referring to FIG. 22, active command ACTG and precharge command PRGG are prepared. Word line WL is driven into the selected state in a selected memory block upon application of active command ACTG. Equalize instruction signal φBLEQ with respect to the selected memory block is inactivated by active command ACTG. After word line WL is driven into the selected state, sense amplifier activation signal SE is activated when a prescribed period of time is elapsed. Bit line isolation control signal φBIU or φBID is set in the state for connecting the memory block and the selected sense amplifier band. When active command ACTG is applied, sense amplifier band designation bit U/D is set to a fixed value, and an upper or lower sense amplifier band is always selected. In accordance with the selected sense amplifier band, bit line isolation control signals φBIU and φBID are driven into the selected or non-selected state.

Therefore, when active command ACTG is applied, as in the conventional case, the sense amplifier circuit performs the sensing operation while connected to the bit line pair of the selected memory cell block, so that the restoring operation is not particularly required.

When precharge command PRGG is applied, selected word line WL in the selected memory cell is driven into the non-selected state, sense amplifier activation signal SE is inactivated and, then, bit line isolation control signals φBIU and φBID both attain to the H level, so that the sense amplifier circuit is connected to the corresponding bit line pair. In addition, bit line equalize instruction signal φBLEQ is also activated and the precharging operation of each bit line pair BLP is performed. Namely, when precharge command PRGG is applied, the precharging operation is performed on the entire bank in accordance with a bank address currently applied.

Figure 23:
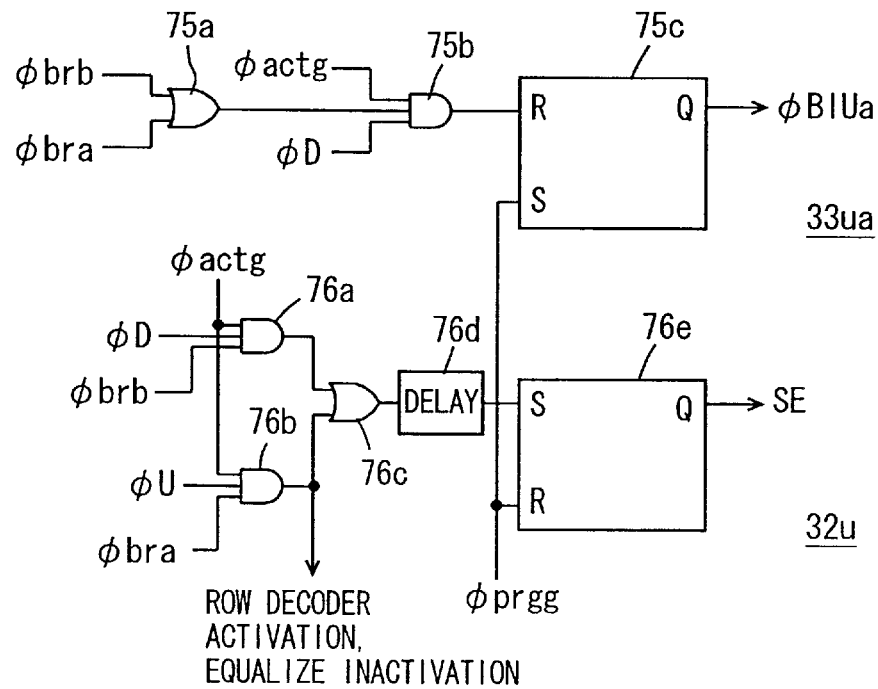
FIG. 23 is a diagram showing exemplary arrangements of the sense amplifier control circuit and an isolator control circuit according to the fourth embodiment of the present invention.

FIG. 23 is a diagram showing arrangements of isolation control circuit 33ua and sense amplifier control circuit 32u.

Referring to FIG. 23, separation control circuit 33*ua* includes: an OR circuit 75*a* receiving block designation signals φbrb and φbra; an AND circuit 75*b* receiving an output signal from OR circuit 75*a*, a global active operation instruction signal φactg, and sense amplifier band designation signal φD; and a set/reset flip flop 75*c* reset upon activation of an output signal from AND circuit 75*b* and set in response to the activation of precharging operation instruction signal φprgg. Bit line isolation control signal φBIUa is output from set/reset flip flop 72*c*.

Signals φactg and φprgg are both one shot pulse signals that are activated upon application of active command (ACTG) and precharging command PRGG, respectively.

Sense amplifier control circuit 32*u* includes: an AND circuit 76*a* receiving global active operation instruction signal φactg, sense amplifier band designation signal φD, and block designation signal φbrb; an AND circuit 76*b* receiving global active operation instruction signal φactg, sense amplifier band designation signal φU, and block designation signal φbra; an OR circuit 76*c* receiving output signals from AND circuits 76*a* and 76*b*; a delay circuit 76*b* delaying an output signal from OR circuit 76*c* by a prescribed period of time; and a set/reset flip flop 76*e* set upon activation of an output signal from delay circuit 76*b* and reset upon activation of precharging operation instruction signal φprgg. Sense activation signal SE is output from set/reset flip flop 76*e*. Activation and inactivation of the row decoder and the bit line equalize circuit arranged for memory block 1*a* are performed in accordance with an output signal from AND circuit 76*b*.

According to the arrangement shown in FIG. 23, when sense amplifier band 2*u* is connected to memory block 1*a*, an output signal from AND circuit 75*b* is at the L level, set/reset flip flop 75*c* is maintained in the set state, and bit line isolation control signal φBIUa is maintained at the H level. On the other hand, if an output signal from AND circuit 76*b* attains to the H level, when a prescribed period of time is elapsed (when a delay time of delay circuit 76*b* is elapsed), set/reset flip flop 76*e* is set, sense amplifier activation signal SE is activated, and the sensing operation is performed.

The arrangements of the bit line isolation control circuit and the sense amplifier control circuit shown in FIG. 23 are arranged corresponding to each bit line isolation circuit block.

In the case of the above described first to the third embodiments, the output signal from each control circuit and an output signal of the sense amplifier control circuit are ORed to be utilized as a control signal.

As described above, according to the fourth embodiment of the present invention, active command ACTG driving a word line into the selected state and performs the operation up to the restoring operation with respect to the memory cell is prepared, and data of the memory block is not 1transferred to and latched in the sense amplifier. Thus, access to the DRAM can be made with a sequence similar to that of the conventional device.

Fifth Embodiment

Figure 24:
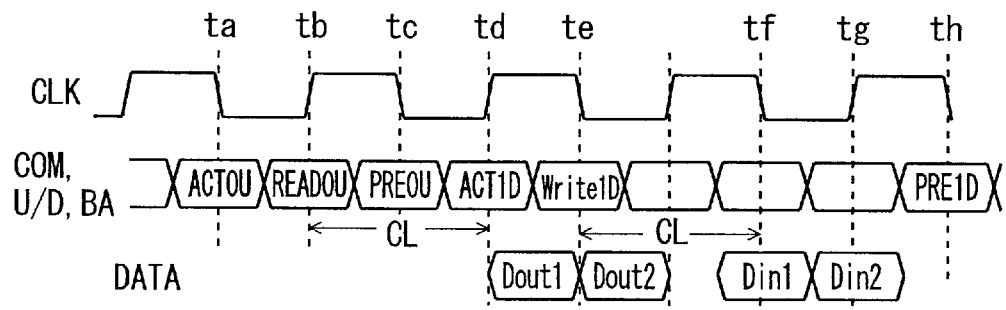
FIG. 24 is a diagram showing an exemplary data access sequence according to a fifth embodiment of the present invention.

FIG. 24 is a diagram showing an exemplary access sequence of a semiconductor memory device according to the fifth embodiment of the present invention.

Referring to FIG. 24, at the rising and falling edges of clock signal CLK, command COM, sense amplifier band designation bit U/D, and a bank address are applied. In synchronization with the falling of clock signal CLK at a time ta, an active command ACT0U with respect to upper sense amplifier band U of bank 0 is applied (incorporated). In bank 0, memory cell data are sensed, amplified and latched by the upper sense amplifier band.

At the rising edge of clock signal CLK at a time tb, a read command READ reading data from the upper sense amplifier band of bank 0 is applied. If column latency CL is one clock cycle of clock signal CLK, data Dout1 and Dout2 are output in synchronization with the rising and falling edges of clock signal CLK starting from time td, respectively.

At a time tc, a precharge command PRE with respect to the upper sense amplifier band of bank 0 is applied. In the data reading mode, data of the sense amplifier circuit has already been transferred to an internal reading circuit by read command READ, so that no problem arises even if the precharging operation is performed. The precharging operation with respect the sense amplifier band is performed and the memory array of bank 0 is returned to the precharged state.

At a time td, active command ACT with respect to the lower sense amplifier band of bank 1 is applied in synchronization with the rising edge of clock signal CLK. Thus, memory cell data is sensed, amplified and latched by the lower sense amplifier band in bank 1. At a time te, a write command WRITE (Write/D) instructing data writing with respect to the lower sense amplifier band of bank 1 is applied at the falling edge of clock signal CLK. If the write command is applied in synchronization with the rising edge of clock signal CLK at time te, write data Din1 and Din2 are transmitted with a delay of one clock cycle.

At times tf and tg, write data Din1 and Din2 are incorporated and sampled in the DRAM at the rising and falling edges of clock signal CLK, respectively. The sampled data Din1 and Din2 are transferred to the internal circuit. The sense amplifier circuit is isolated from the bit line pair, the load thereof is small, and write data from the write driver can be transferred to the sense amplifier circuit at a high speed. Accordingly, even if precharge command PRE is applied to the lower sense amplifier band of bank 1 at the falling edge of clock signal CLK at a time th, the write data has already been transferred to the lower sense amplifier band of bank 1, so that the precharging operation is performed on the sense amplifier band in accordance with precharge command PRElD. When precharge command PRELD and PREOU are applied, the precharging operation is performed after the restoring operation. Thus, memory cell data is accurately accessed without causing destruction of writing and reading data.

According to the access sequence with respect to the memory shown in FIG. 24, data is accessed by utilizing both of rising and falling edges of clock signal CLK, so that fast access is achieved and efficiency of the data bus utilization is improved. In addition, the time during which data of the data bus does not exist is reduced, so that the bus utilization efficiency can be improved.

Therefore, in the first to the fifth embodiments, when data is transferred in the DDR mode, the command can also be transferred in synchronization with the rising and falling edges of clock signal CLK. This is because data access with respect to a sense amplifier circuit is performed with the sense amplifier band being isolated from the bit line pairs and the time required for writing data is reduced. Column latency CL in the reading operation is determined according to the internal configuration of the DRAM array. Similarly, in this case, the sensing operation is performed by a sense amplifier circuit with the sense amplifier circuit and the bit line pair being isolated, data latched at the sense amplifier circuit can be driven into the definite state at a high speed, and data reading is performed at a faster timing, so that the time corresponding to column latency CL is reduced for fast access.

Figure 25:
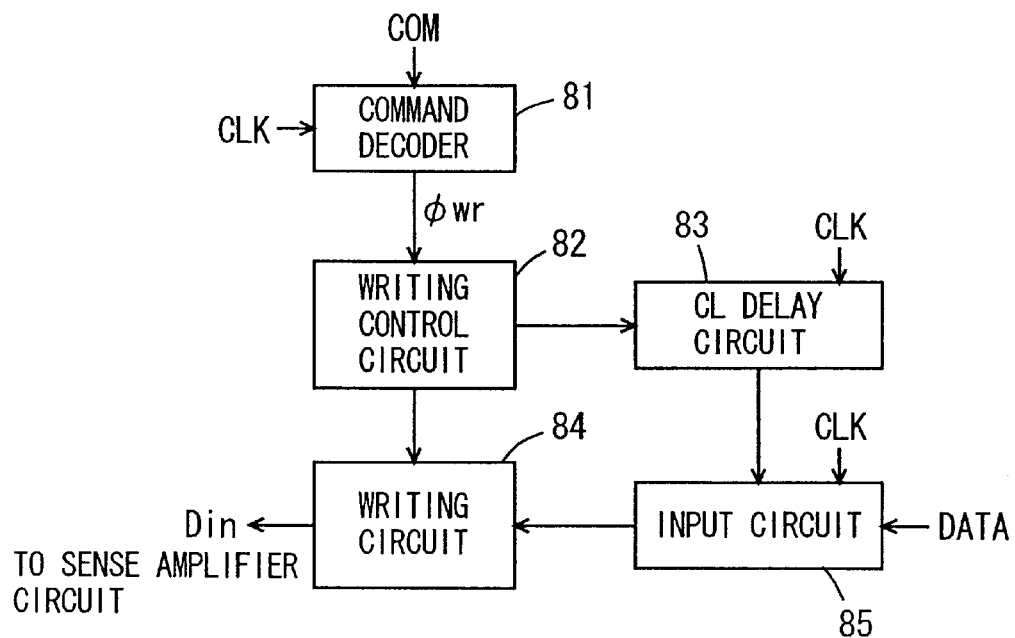
FIG. 25 is a diagram schematically showing an exemplary arrangement of a data writing portion according to the fifth embodiment of the present invention.
Figure 27:
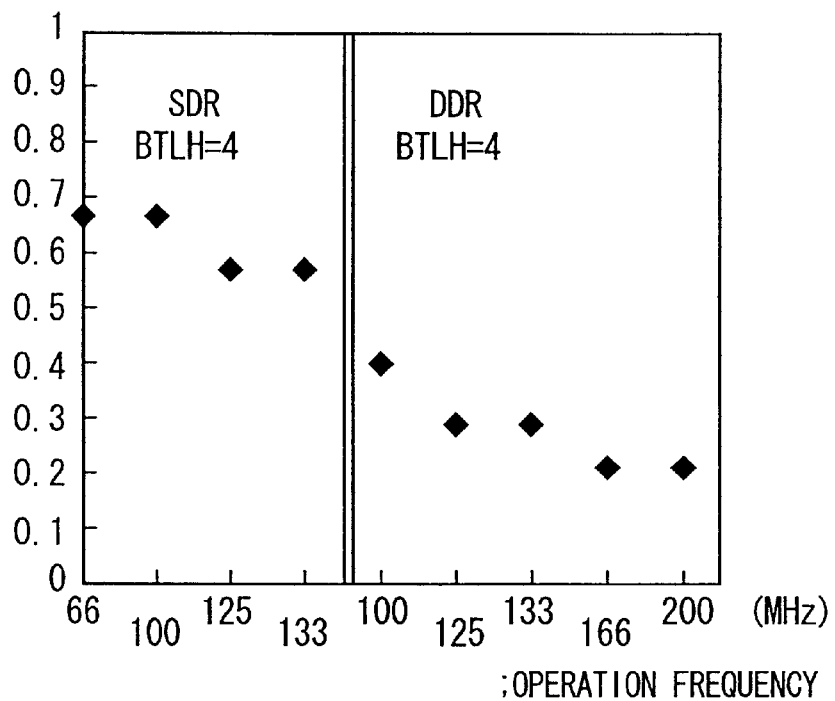
FIG. 27 is a graph showing a relationship between a bus utilization efficiency add an operation frequency of the conventional semiconductor memory device.

FIG. 25 is a diagram schematically showing an arrangement of a data writing portion for the access sequence shown in FIG. 24. Referring to FIG. 25, the data writing portion includes: a command decoder 81 incorporating command COM in synchronization with clock signal CLK for activating a writing operation instruction signal φwr when command COM is a write command; a writing control circuit 82 controlling a writing operation in accordance with writing operation instruction signal φwr from command decoder 81; a CL delay circuit 83 delaying a writing operation activation signal from writing a control circuit 82 by a period of a column latency; and input circuit 85 incorporating data DATA in synchronization with clock signal CLK in accordance with the writing activation signal from CL delay circuit 83; and a writing circuit 84 activated under control of writing control circuit 82 for incorporating writing data applied from input circuit 85, generating internal write data Din and transmitting it to a selected memory cell.

Writing control circuit 82 generates a signal for activating the writing operation for a period corresponding to a burst length in a prescribed sequence upon activation of writing operation instruction signal φwr. Writing circuit 84 includes an internal write data transfer circuit and a write driver, transfers data applied from input circuit 85 in synchronization with the clock signal under control of writing control circuit 82, and writes it to a selected memory cell. Input circuit 85 incorporates data DATA in synchronization with the rising and falling edges of clock signal CLK upon activation of a writing control signal applied from CL delay circuit 83 and transmits the incorporated data to writing circuit 84. Input circuit 85 may convert data DATA transmitted at the rising and falling edges of clock signal CLK to parallel data and apply it to writing circuit 84.

Although not shown in FIG. 25, a column selection circuit (not shown) is activated in response to activation of writing operation instruction signal φwr from command decoder 81 for performing a column selection operation in a designated bank. Writing circuit 84 is only required to drive a sense node of the sense amplifier circuit, but not required to drive the bit line pair. Therefore, a driving load of writing circuit 84 is small, so that write data can be transferred to the selected sense amplifier at a high speed.

As described above, according to the fifth embodiment of the present invention, the command is incorporated in synchronization with both of the rising and falling edges of the clock signal and, in the data writing operation, the write data is incorporated when the column latency is elapsed. Thus, operation timings of the input/output circuit for writing and reading data of DRAM are the same, so that control is facilitated.

It is noted that, in the access sequence shown in FIG. 24, commands ACTLD and WRITELD with respect to the lower sense amplifier band of bank 1 may be applied while being delayed by one clock cycle. Namely, write command WRITELD may be applied in synchronization with the falling edge of clock signal CLK at time tf.

In the above described first to the fifth embodiments, a clock synchronous semiconductor memory device (SDRAM) operating in synchronization with clock signal CLK has been described. However, the present invention can be applied to any DRAM in which memory cell data is read destructively, and sensed, amplified and latched by the sense amplifier.

As in the foregoing, according to the present invention, consecutive accesses are performed without causing any penalty in page switching.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a plurality of memory cells arranged in rows and columns;

a plurality of sense amplifier circuits arranged corresponding to the columns for sensing, amplifying and latching memory cell data of corresponding columns when activated, said plurality of sense amplifier circuits being divided into a plurality of groups;

connecting circuitry responsive to a row select instruction and a sense amplifier group designation for isolating sense amplifier circuits of a designated sense amplifier group and corresponding columns when a prescribed period of time is elapsed, said prescribed period of time including a period in which data of a memory cell in a row selected in response to said row selection instruction is transmitted to a corresponding sense amplifier circuit;

sense controlling circuitry for activating sense amplifier circuits of the sense amplifier group designated by said sense amplifier group designation when said prescribed period of time is elapsed; and row selecting circuitry for bringing the row selected in response to said row selection instruction into a non-selected state when said prescribed period of time is elapsed after the selected row is driven into a selected state in response to said row selection.

2. The semiconductor memory device according to claim 1, further comprising circuitry for driving the selected row in said non-selected state back into the selected state by an externally applied restoring instruction and connecting the sense amplifier circuit and a corresponding column.

* * * * *